(12) United States Patent
Lang et al.

(10) Patent No.: US 12,402,233 B2
(45) Date of Patent: Aug. 26, 2025

(54) SYSTEM FOR CHECKING A LUMINAIRE STATUS AND METHOD THEREOF

(71) Applicant: Schreder S.A., Brussels (BE)

(72) Inventors: Vincent Lang, Grâce-Hollogne (BE); Laurent Secretin, Remicourt (BE); Arnaud Leclercqs, Liege (BE); Paul Bawin, Liege (BE)

(73) Assignee: Schreder S.A., Brussels (BE)

( * ) Notice: Subject to any disclaimer, the term of this patent is extended or adjusted under 35 U.S.C. 154(b) by 437 days.

(21) Appl. No.: 17/906,919

(22) PCT Filed: Mar. 26, 2021

(86) PCT No.: PCT/EP2021/058037
§ 371 (c)(1),
(2) Date: Sep. 21, 2022

(87) PCT Pub. No.: WO2021/191454
PCT Pub. Date: Sep. 30, 2021

(65) Prior Publication Data
US 2023/0209692 A1    Jun. 29, 2023

(30) Foreign Application Priority Data

Mar. 26, 2020 (NL) .................................... 2025215
Mar. 26, 2020 (NL) .................................... 2025216

(51) Int. Cl.
*H05B 47/19* (2020.01)
*G01R 31/26* (2020.01)
*H05B 47/23* (2020.01)

(52) U.S. Cl.
CPC ....... *H05B 47/235* (2020.01); *G01R 31/2635* (2013.01)

(58) Field of Classification Search
CPC ........ H05B 47/19; H05B 47/22; H05B 47/29; H05B 47/105; H05B 47/115;
(Continued)

(56) References Cited

U.S. PATENT DOCUMENTS 8,575,861 B1   11/2013 Gordin et al.
9,655,216 B2 *  5/2017 Murakami ............. H05B 45/10
(Continued)

FOREIGN PATENT DOCUMENTS

WO   2012143814 A1   10/2012
WO   2019134899 A1    7/2019
WO   2019175439 A1    9/2019

OTHER PUBLICATIONS

PCT International Search Report and Written Opinion, Application No. PCT/EP2021/058037, mailed Jun. 14, 2021, 16 pages.

*Primary Examiner* — Tung X Le
(74) *Attorney, Agent, or Firm* — McDonnell Boehnen Hulbert & Berghoff LLP

(57) ABSTRACT

Example embodiments relate to systems for checking a luminaire status and methods thereof. One embodiment includes a method for checking a status of a luminaire using a mobile terminal in a vicinity of the luminaire. The mobile terminal includes a sensing means, a memory, and a communication means. The method includes obtaining, by the mobile terminal, an identifier of the luminaire. The method also includes determining, based on the obtained identifier of the luminaire, a measure of the status of the luminaire to be acquired. Additionally, the method includes acquiring, by the sensing means of the mobile terminal, the measure of the luminaire status. Further, the method includes storing, in the memory of the mobile terminal, data about the acquired measure of the luminaire status. The data is associated to the identifier of the luminaire.

20 Claims, 7 Drawing Sheets

(58) Field of Classification Search
CPC ............... H05B 47/125; H05B 47/235; H05B 47/1965; H05B 47/1975; H05B 47/1985; H05B 47/165; H05B 47/175; H05B 47/185

See application file for complete search history.

(56) References Cited

U.S. PATENT DOCUMENTS

| | | | |
|---|---|---|---|
| 10,085,328 B2 * | 9/2018 | Barna | H05B 47/115 |
| 10,405,404 B1 * | 9/2019 | Trickler | H04L 67/125 |
| 2014/0244433 A1 | 8/2014 | Cruz | |
| 2019/0034043 A1 * | 1/2019 | Zolotykh | H05B 47/1985 |
| 2021/0265917 A1 * | 8/2021 | Malone | H02J 7/007 |

* cited by examiner

SYSTEM FOR CHECKING A LUMINAIRE STATUS AND METHOD THEREOF

CROSS-REFERENCE TO RELATED APPLICATIONS

The present application is a national stage entry of PCT/EP2021/058037 filed Mar. 26, 2021, which claims priority to NL 2025215 filed Mar. 26, 2020 and NL 2025216 filed Mar. 26, 2020, the contents of each of which are hereby incorporated by reference.

FIELD OF INVENTION

The present invention relates to methods and systems for checking a luminaire status, in particular using a mobile terminal.

BACKGROUND

It is known to provide a luminaire with a control and communication circuit with at least one sensor adapted to measure a quantity related to, for example, a status of the luminaire corresponding to the angular positioning of the luminaire. The at least one sensor allows the control and communication device to send to a remote server a datum relative to the angular positioning, or an angular positioning change, of the luminaire. For example, the at least one sensor is an acceleration sensor. The measurements provided by the at least one sensor can for example be processed locally but, alternatively or in addition, can also be processed in the remote server. Thanks to the provision of the at least one sensor, the control and communication circuit can remotely communicate data related to the angular positioning of the luminaire, associate this data to the related luminaire, and detect an accidental change of angular positioning due for example to the action of the weather or environmental conditions, such as, for example, the wind or vegetation, that vary the angular positioning with respect to the angular positioning conditions set in the installation step or a change of angular positioning due for example to the support being knocked down by a traffic accident or an change of angular positioning due to the subsidence of the foundation base. The control and communication device may store a datum related to the angular positioning set during the installation step, for example, acquired via the at least one sensor, to estimate variations of angular positioning (via the at least one sensor) and to send to the remote server messages and/or alarms related to variations of inclination that, exceeding a predetermined threshold, require maintenance of the lighting apparatus and/or the support pole. The angular positioning may be defined by one or more tilt angle of the luminaire, said tilt angle corresponding to a yaw angle, a pitch angle, or a roll angle.

The above example is directed to the angular positioning of the luminaire but can be applied similarly to other sensors provided to the luminaire. By providing the luminaire with the control and communication circuit and the at least one sensor, a given luminaire status may be readily obtained. Nonetheless, it is to be noted that providing sensors and/or communication means to every luminaire may prove to be costly for a customer. Also, the required sensor to perform a predetermined measure may be absent from the luminaire and/or the required sensor of the luminaire may be malfunctioning. Hence, there is a need for a system and method capable of checking a luminaire status solving these issues.

Also, luminaires, in particular outdoor luminaires, comprise a luminaire housing in which at least one light source is arranged. Typically, the at least one light source comprises a plurality of light-emitting diodes (LEDs). For example, a luminaire may comprise a luminaire pole and a luminaire head formed by the luminaire housing. In other luminaires, the luminaire head may be connected to a wall. A driver for the at least one light source, typically in the form of a LED driver, may be arranged in or on the luminaire head, in or on the luminaire pole, or in any other suitable location of the luminaire. Further, outdoor luminaires typically use control modules containing different control blocks and/or sensors, e.g. a light sensor for sensing the light level of ambient light to automatically control the light sources. Thus, typically a large number of components and connection means are present in a luminaire, and those components and connection means may be subject to aging and/or failure after a certain number of years.

Typically, when having to repair a luminaire or when having to perform maintenance on a luminaire (e.g. an upgrade or a replacement of a component likely to fail in the future), this operation takes place many years after installation and it is difficult for maintenance staff to prepare for such repair or maintenance operations as they do not know which failing or aged components need replacement. For example, typically, it is difficult to know the wiring and/or fixation means that have been used many years before. Further, components included in luminaires, especially outdoor luminaires, are typically difficult to access as a luminaire head is typically located at a significant height above the ground and has to be opened. Thus, it would be desirable to be able to make sure that the maintenance staff can obtain all components needed for the maintenance without having to visit the premises of the luminaire beforehand.

Also, because of the large amount of components that needs to be electrically and/or mechanically interconnected inside a luminaire housing, quality control of luminaires is typically difficult to implement, or requires extensive testing.

SUMMARY

The object of embodiments of the invention is to provide an improved system and method for checking a status of a luminaire, more in particular using a mobile terminal. More specifically, embodiments of the invention aim to provide a system and method which allow a field operator for checking the luminaire status in a flexible and user-friendly manner, and keep a trace of the measure performed such that it can be directly linked to the related luminaire.

According to a first aspect of the invention, there is provided a method for checking a status of a luminaire. The method uses a mobile terminal in a vicinity of the luminaire. The mobile terminal includes a sensing means, a memory, and a communication means. The method comprises the steps, performed in the following order, of:
  obtaining, by the mobile terminal, an identifier of the luminaire;
  determining, based on the obtained identifier of the luminaire, a measure of the status of the luminaire to be acquired;
  acquiring, by the sensing means of the mobile terminal, the measure of the luminaire status;
  storing, in the memory of the mobile terminal, data about the acquired measure of the luminaire status, said data being associated to the identifier of the luminaire.

Embodiments of the invention are based inter alia on the insight that with the accelerated emergence of multifunctional luminaires and increase in the customization of the luminaires, requirements in the compliance of the luminaire relative to various parameters, as well as the variety of said various parameters, have increased. However, despite the usefulness of being able to monitor precisely the status of a given luminaire with respect to various parameters, providing sensors to every luminaires for monitoring all luminaires statuses can be costly, malfunctioning of sensors can occur, and retrofitting of luminaires to make them "smarter" can be cumbersome. This problem is overcome by a method as defined above.

During maintenance or installation of the luminaire, a field operator may need to check the status of the luminaire. The status of the luminaire may correspond to a measurable characteristic characterizing the luminaire, an environment of the luminaire, or a subpart of the luminaire. For example, the measurable characteristic of the luminaire may be any one of, but not limited to: angular positioning of a luminaire head of the luminaire, geo-localization of the luminaire, arrangement of the components in the luminaire head of the luminaire, connectivity of a communication unit of the luminaire, sound level in the surrounding environment of the luminaire, amount of light at a time of the day in proximity of the luminaire, light distribution of the luminaire head of the luminaire, status of a component being part of the luminaire, ambient temperature, etc.

The luminaire is associated to an identifier. The identifier may be a unique identifier. Due to the association of the identifier and the luminaire, any measure obtained via the mobile terminal may be easily linked to the corresponding luminaire using the identifier. Also, thanks to the identifier, the field operator may establish which luminaire status is to be determined, and thus which measure is to be performed. In other words, obtaining the identifier by the mobile terminal is the first step to be performed, based upon which the specific status or statuses of the luminaire to be measured are determined. For example, the determining may comprise receiving said status or statuses to be measured from a remote terminal upon transmission of the obtained identifier to said remote terminal, or retrieving said status or statuses to be measured from an internal memory of the mobile terminal.

In embodiments of the invention, the method uses a mobile terminal in a vicinity of the luminaire to be able to rely on a sensing means included in the mobile terminal. The mobile terminal may be, e.g. a laptop, a smartphone, a tablet, wearable device, or a dedicated mobile terminal. The measure of the luminaire status is acquired using the sensing means of the mobile terminal. Depending on the sensing means, the field operator may measure parameters not otherwise available to sensors of the luminaire, thereby increasing the flexibility of the process of luminaire status determination. Additionally, even if a sensor of the luminaire may acquire a measure of the same kind as the measure performed by the sensing means of the mobile terminal, the measure performed by the sensing means may allow improvement in the measure precision and/or in the measure reliability.

After acquisition of the measure, data related to said measure is linked to the unique identifier of the luminaire when stored, allowing for easy post-processing and sorting. Additional data may be joined when storing data about the acquired measure associated to the identifier, e.g. a time stamp of the checking of the luminaire status, and/or a location stamp of the checking of the luminaire status, and/or an identification of the field operator having performing the checking of the luminaire status using the mobile terminal. When carrying out maintenance or installation of a plurality of luminaires, the inherent portability of the mobile terminal gives user-friendliness in repeating the method across the plurality of luminaires.

It is to be noted that, in the context of the present invention, the vicinity of the luminaire may be defined as a distance from the luminaire allowing to acquire a representative measure of the desired luminaire status.

Additionally, other steps may optionally be performed between the steps of the method described above. In an embodiment, the above described method may be implemented during a first installation of a luminaire, such as when mounting a luminaire head to a support, e.g. pole, wall. After or before the step of determining a measure of the status of the luminaire to be acquired, installation information relative to the luminaire may be obtained, e.g. from an internal memory of the mobile terminal or from a remote terminal, which may be then outputted in a visual and/or a vocal manner to the field operator. Such installation information may include e.g. a digital data set or a portion thereof as described below in connection with the fourth and following aspects. The step of acquiring the measure of the luminaire status may be helpful in determining whether the installation has been done as desired.

In an embodiment, the identifier of the luminaire is unique to the luminaire and data related to the luminaire is associated to the identifier. Additionally, there may be one or more additional identifier, said additional identifiers being associated to different parts of the luminaire, e.g. one identifier per luminaire head of a luminaire including a plurality of luminaire heads, one identifier per component of the luminaire. The data about the acquired measure may be associated to the relevant identifier of the luminaire part in addition to the identifier of the luminaire. The identifier may be provided directly to a surface of the luminaire head or of the luminaire support in case of a visually readable identifier, or may be obtained within a certain range of RF communication centered on the luminaire. The skilled person will understand that there are various ways to assign a unique identifier to a specific object such as a luminaire, e.g. geo-localization coordinates, bar code, QR code, serial number, unique symbol or image, NFC-transmitted code such as a RFID tag.

According to a preferred embodiment, the determining of the measure of the luminaire status to be acquired includes:
transmitting to a remote terminal, by the communication means of the mobile terminal, the obtained identifier of the luminaire; and
receiving from the remote terminal, by the communication means of the mobile terminal, an instruction about the measure of the luminaire status to be acquired based on the obtained identifier of the luminaire.

In this manner, the mobile terminal may be communicating with a remote terminal to obtain directly what is inquired regarding the luminaire status. The remote terminal may be a terminal, said terminal including a communication means, a processing means, and a memory, located at a distance from the luminaire and being apt for communicating with the luminaire, e.g. another luminaire, another mobile terminal, a remote server. Preferably the remote terminal is a remote server for centrally handling a plurality of luminaires, preferably in a luminaire network. Communication with the remote terminal may be established wirelessly or in a wired manner Data may be sent via a wireless network operating over short-range or long-range communication, e.g. Bluetooth, Wi-Fi, Zigbee, LORA (IoT), IR, cellular, or via a wired network, e.g. Ethernet, DALI, DMX, RS485, USB.

The instruction about the measure received from the remote terminal may comprise an indication about one or more measurement required in order to obtain the measure, e.g. a specific tilt angle of the luminaire head, a sound level, a light amplitude, a photo of wirings within the luminaire head, and/or may comprise one or more guideline on how to accomplish the one or more measurement required to obtain the measure.

According to an exemplary embodiment, the determining of the measure of the luminaire status to be acquired includes:

retrieving, from the memory of the mobile terminal, an instruction about the measure of the luminaire status to be acquired based on the obtained identifier of the luminaire.

In this way, the mobile terminal can operate in a stand-alone manner in order to determine the measure of the luminaire status to be acquired.

Note that the retrieving of the instruction from the memory of the mobile terminal is not exclusive of the receiving of the instruction from the remote terminal. For example, part of the instruction about the measure to be acquired may be available from the memory of the mobile terminal and another part of the instruction about the measure to be acquired may be available from the memory of the remote terminal; both the part and the another part of the instruction may be gathered such that the measure of the luminaire status to be acquired is determined.

According to a preferred embodiment, the method further comprises:

transmitting, preferably to a remote terminal, by the communication means of the mobile terminal, the data about the acquired measure of the luminaire status associated to the identifier of the luminaire.

In this manner, most of the data related to luminaire statuses of a plurality of luminaires in a luminaire network can be centralized in the remote terminal for further processing and/or sorting.

According to an exemplary embodiment, the method further comprises:

determining, based on the acquired measure of the luminaire status, the luminaire status.

In this way, the luminaire status is established. The determination of the luminaire status based on the acquired measure may be achieved with or without processing the acquired measure in the mobile terminal and/or at the remote terminal.

In an embodiment, a certain amount of light may be measured by a light sensing means of the mobile terminal on the premises of the luminaire. This amount of light may be processed to remove white noise from the measured amount of light, said white noise originating from a sensor of the light sensing means, in order to obtain the luminaire status corresponding to the luminaire environmental light.

In embodiments of the luminaire comprising a photocell to control the switching of the main lighting unit, the photocell of the luminaire may have aged and there may be a need to check whether the measurement from the photocell is still accurate. To check the status of the photocell, the amount of light measured by the sensing means of the mobile terminal may be compared to the amount of light measured by the photocell. In another embodiment, the light sensing means of the mobile terminal may measure the amount of light on the premises of the luminaire to determine the background light level status of the luminaire; and the determined background light level status of the luminaire may be used to adapt the switching threshold controlled by the photocell of the luminaire.

In yet another embodiment, the field operator may capture with the mobile terminal an image of a light distribution of the luminaire on a surface to be illuminated to check the light distribution status of the main lighting unit. In still another embodiment, the field operator may capture with the mobile terminal an image of the luminaire with the main lighting unit switched on to check the mains connection status of the luminaire.

Depending on embodiments, capturing one or more images with the mobile terminal may be useful in determining a great variety of luminaire statuses. For example, it may be useful to determine an inclination/orientation status of the luminaire and its luminaire head(s). It may also be useful in determining an environment status of the luminaire surroundings. It may be useful in determining obstacle presence relative to a lighting unit of the luminaire. It may be useful in determining a wiring status or an arrangement status of components within a luminaire head of the luminaire.

The skilled person will understand that various kinds of acquired measures may be processed accordingly to determine the luminaire status. As part of the overall monitoring and supervising of a luminaire network, the determined luminaire status may serve as a basis for future actions.

According to a typical embodiment, the method further comprises:

obtaining information indicating whether the luminaire status is correct based on the determined luminaire status and a reference status, said information optionally comprising a required correction.

By this approach, comparison of the determined luminaire status is executed, the result of which may be the basis for future actions on the luminaire More specifically, the luminaire status may be compared with the reference status, said reference status corresponding, for example, to an expected value or state of the luminaire status. Depending on the difference between the luminaire status and the reference status, the luminaire status may be estimated as correct or incorrect depending whether the luminaire status deviates out of a predetermined range away from the reference status. An indication of the luminaire status being incorrect may lead to, e.g. a maintenance operation by the field operator, the checking of another luminaire status, and/or a further action by the remote terminal. Optionally, there may be a plurality of reference statuses and the luminaire status may be characterized by a plurality of values or states depending on the comparison of the luminaire status with the plurality of reference statuses. The skilled person will understand that the reference status may be understood in a broad manner and may also include Boolean values or states, such as the presence or absence of an element.

For example, when installing a luminaire head of the luminaire on a pole, the pole diameter onto which the field operator has to fix the luminaire head is unknown. Obtaining the measure corresponding to the pole diameter via the mobile terminal, the field operator could get instruction to use a first pole adapter, a second pole adapter, or no adapter at all, by comparing the pole diameter status of the luminaire to a plurality of reference statuses, said plurality of reference statuses each corresponding to a different case use of a pole adapter.

According to a preferred embodiment, the luminaire includes a luminaire head. The sensing means of the mobile terminal comprises an accelerometer. The acquiring of the measure of the luminaire status comprises:

provifing the mobile terminal to a predetermined surface of the luminaire head; and acquiring, via the accelerometer of the mobile terminal, a measure for at least one tilt angle representative for an angular positioning of the luminaire head.

In this manner, the field operator may conveniently check the luminaire status corresponding to the angular positioning of the luminaire head of the luminaire using the mobile terminal only, or may complement available data about the luminaire head angular positioning. The angular positioning may be defined by one or more tilt angle, said tilt angle corresponding to a yaw angle, a pitch angle, or a roll angle of the luminaire head. The predetermined surface of the luminaire head may be a substantially flat surface configured for cooperating with a corresponding external surface of the mobile terminal, optionally with a holder configured for holding in place the mobile terminal. The predetermined surface of the luminaire head may be an external surface of the housing of the luminaire head or a surface inside the housing of the luminaire head. The predetermined surface of the luminaire head may be defined with a predetermined inclination with respect to a horizontal plane, said predetermined inclination being defined by a yaw, pitch, and/or roll angle, allowing to determine the luminaire status corresponding to the luminaire head angular positioning based on the acquired measure and taking into account the predetermined inclination of the predetermined surface.

In another embodiment, the mobile terminal may be mounted to a clamping device. The clamping device may be configured for being provided to the luminaire head such as to fix the mobile terminal with respect to the luminaire head at a desired angular positioning. In still another embodiment, the mobile terminal may be mounted to a suction device, said suction device being configured for being attach'r to a surface of the luminaire using suction. In yet another embodiment, the luminaire head may comprise a socket, e.g. a twist-lock socket and the mobile terminal may be mounted to a support having a corresponding interface, e.g. a twist-lock interface configured for being provided to the socket. Optionally, the mobile terminal may be linked to the field operator via a lifeline configured for preventing the mobile terminal to fall to the ground in case of a fall of the mobile terminal.

Such socket may be configured to receive a pluggable control module. Preferably, the socket is one of a NEMA or Zhaga socket, and the pluggable control module is a module configured to be plugged in such socket. According to an exemplary embodiment, the socket may be implemented as described in PCT publication WO2017/133793 in the name of the applicant, which is included herein by reference. Optionally, the socket and control module may be configured and/or mounted as described in patent application PCT/EP2020/068854 or PCT/EP2020/060751 in the name of the applicant, which are included herein by reference. The socket and the control module may be configured to be coupled through a twist-lock mechanism, e.g. as described in ANSI C136.10-2017 standard or ANSI C136.41-2013 standard or Zhaga Interface Specification Standard (Book 18, Edition 1.0, July 2018, see https://www.zhagastandard.org/data/downloadables/1/0/8/1/book_18.pdf or Book 20: Smart interface between indoor luminaires and sensing/communication modules), which are included herein by reference.

According to an exemplary embodiment, the mobile terminal comprises an output means. The obtaining of information indicating whether the luminaire status is correct comprises:

obtaining information comprising the required correction; and outputting, by the output means of the mobile terminal, an information correlated with the required correction.

In this way, the field operator may be assisted when performing different manipulations of the mobile terminal and/or of the luminaire during the implementation of the method in order to facilitate some of these manipulations. The output means may be at least one of: a display, a speaker, a vibration unit, and/or a light source of the mobile terminal. In an embodiment, the field operator may be performing correction and the correlation in signal outputted by the output means may vary as the luminaire status improves or worsens. The variations in the outputted signal correlated with the required correction may be a variation in intensity of the signal, frequency of the signal, in an image-based signal such as variation in color, and/or spoken or written language outputted.

According to a favored embodiment, the information further includes an indication of a replacement kit for a luminaire to be used, typically to be used upon failure of the luminaire or a maintenance requirement of the luminaire; wherein a method for preparing the replacement kit comprises the steps of:

during manufacturing of a luminaire, taking one or more images, said one or more images comprising at least an image of an interior part of a housing of the luminaire;

after installation of said luminaire in the field, upon failure of the luminaire or when performing maintenance of the luminaire, preparing a replacement kit for the luminaire using at least one of:

the one or more images and a digital dataset based on the one or more images.

According to a preferred embodiment, the sensing means of the mobile terminal comprises an image capturing means. The obtaining of the identifier comprises:

acquiring, via the image capturing means of the mobile terminal, a visual representation, preferably a QR code or a barcode, of the identifier, said visual representation being provided to a surface in proximity to the luminaire; and obtaining, by the mobile terminal, the identifier of the luminaire based on the acquired visual representation.

In this manner, the identifier can be provided to any existing or new luminaire easily, for example by sticking a label with the visual representation on the surface in proximity to the luminaire. The visual representation may be generated quickly. The visual representation may be arranged on the luminaire support, e.g. a pole of the luminaire, on an internal surface of the luminaire accessible to the field operator, on a surface of the luminaire head, on any component inside the luminaire head, or on any module of the luminaire.

The skilled person will understand that the hereinabove described technical considerations and advantages for method embodiments also apply to the below described corresponding system embodiments, mutatis mutandis.

According to a second aspect of the invention, there is provided a system including a mobile terminal and a luminaire. The system is for checking a status of the luminaire using the mobile terminal in a vicinity of the luminaire. The mobile terminal comprises:
- a sensing means;
- a memory;
- a communication means; and
- a controlling means, said controlling means being configured for controlling the steps of the method of any one of the method embodiments above mentioned.

According to an exemplary embodiment, the luminaire comprises a luminaire head with a predetermined surface. The predetermined surface of the luminaire head may be an external surface of the housing of the luminaire head or a surface inside the housing of the luminaire head. The sensing means of the mobile terminal comprises an accelerometer. The predetermined surface is configured for receiving the mobile terminal. After providing the mobile terminal to the predetermined surface of the luminaire head, the controlling means, to acquire the measure of the luminaire status, controls the mobile terminal to acquire, via the accelerometer, a measure of at least one tilt angle representative for an angular positioning of the luminaire head. Additionally, the mobile terminal may comprise an output means, and the controlling means may control the mobile terminal to:
- obtain information comprising a required correction of the luminaire status; and
- output, by the outputs means of the mobile terminal, an information correlated with the required correction.

According to a preferred embodiment, the mobile terminal comprises an output means. The controlling means is further configured for controlling the output means such that controlling the steps of the method of any one of the method embodiments above mentioned is at least partially assisted by information outputted by the output means.

In this way, performing the steps of the method and manipulating the mobile terminal during the implementation of the method may be made easier by the at least partial output of information through the output means. The output means of the mobile terminal may comprise a display, a speaker, a vibration unit, an augmented-reality device, and/or a light source. In an embodiment, the outputted information may be information correlated to the required correction to the luminaire status. In another embodiment, the outputted information may be a video assistance on the display of the mobile terminal showing to the field operator how to manipulate the mobile terminal during the implementation of the method. Depending on embodiments, the outputted information may be a video assistance on the display of the mobile terminal showing to the field operator how to handle the luminaire and/or one or more components of the luminaire. The skilled person will understand that assistance may be provided through numerous ways to the field operator depending on the output means available.

According to an exemplary embodiment, the mobile terminal comprises an input means. The controlling means is further configured for controlling the input means such that controlling the steps of the method of any one of the method embodiments above mentioned is at least partially assisted by command inputted via the input means.

In this manner, performing the steps of the method and manipulating the mobile terminal during the implementation of the method may be made easier by the at least partial input of commands through the input means. The input means of the mobile terminal may comprise at least one of: a touch-enabled input panel, a touchscreen, a keyboard, a switch or button, an image capturing means, and/or a sound capturing means. In addition, the mobile terminal may also comprise the output means and performing the steps of the method by the controlling means is such that it is also at least partially assisted by information outputted by the output means. In an embodiment, the mobile terminal may comprise a speaker and a sound-capturing means allowing for an at least partially speech controlled implementation of the method. In another embodiment, the field operator may complete any of the steps of the method by a manual entry of information on the mobile terminal via the keyboard or the touch-enabled input panel of the mobile terminal.

According to a preferred embodiment, the mobile terminal further comprises a display. The controlling means is further configured for controlling the display to display information about the controlling performed by the controlling means. The display may also be used to output information correlated with the required correction of the luminaire status.

In this way, the user-friendliness in implementing the method for checking the luminaire status is improved by visual assistance. The information displayed may be, e.g. one or more guideline to assist the field operator in conducting the steps of the method using the mobile terminal, informing the field operator about the progress of the checking of the luminaire status, an input demand from the mobile terminal to be inputted by the field operator via the input means of the mobile terminal.

According to an exemplary embodiment, the controlling means is configured to display a geographical map indicating the luminaire for which checking of the luminaire status is required, prior to performing the step of obtaining the identifier.

In this manner, there is a clear map overview of the geographical positioning of the luminaires needing attention, and the field operator can plan accordingly. Optionally, the geographical map may also indicate an optimized path between the luminaires needing attention based on multiple factors, such as the distance from one luminaire to another one, the time of the day, the type and/or number of measures to be acquired, the road traffic, etc.

According to a preferred embodiment, the controlling means is configured to display an overview of the measure of the luminaire status to be acquired and the associated identifier of the luminaire, prior to performing the step of obtaining the identifier.

In this way, there is a clear overview for the field operator of the tasks at hand for planning.

According to an exemplary embodiment, the sensing means of the mobile terminal includes at least one of: an accelerometer, an image capturing means, a light sensing means, a sound capturing means, a geo-localization means, a temperature sensing means, an antenna, a motion sensor, a pollution sensor, a visibility sensor, a radar sensor.

In this manner, the mobile terminal may be able to be used for a broad range of measurements relative to the luminaire status. Optionally, the luminaire and the sensing means of the mobile terminal may be used to determine the same luminaire status. The luminaire status determined in these two manners may be compared in order to cross-validate sensing means of the luminaire and sensing means of the mobile terminal.

The skilled person will understand that the hereinabove described technical considerations and advantages for method and system embodiments also apply to the below described corresponding embodiments of a method for installing a luminaire, mutatis mutandis.

According to a third aspect of the invention, there is provided a method for installing a luminaire. The method uses a mobile terminal in a vicinity of the luminaire. The method comprises:
mounting a luminaire head of the luminaire;
performing, using the mobile terminal, the steps of the method of any one of the method embodiments above mentioned;
optionally, performing a required correction; wherein the required information is obtained when obtaining information indicating whether the luminaire status is correct based on the determined luminaire status, said information comprising the required correction.

Additionally, the identifier of the luminaire may be linked to one or more images taken during manufacturing of the luminaire. Installation instructions may be obtained by the mobile terminal and may be based on the one or more images taken during manufacturing of the luminaire and associated to the obtained identifier.

Optionally, the acquisition of the measure of the luminaire status may help in determining a cause of failure of the luminaire, and, based on the one or more images taken during manufacturing of the luminaire associated to the identifier, a replacement kit to solve the failure of the luminaire may be prepared. For example, the one or more images may be used for troubleshooting and diagnostic of a failure, such as a flickering light, a burnt component, a wrong cabling, etc. Different measures may help in discriminating what is the source of the failure and obtain an appropriate replacement kit.

The object of further embodiments of the invention is to provide a method for preparing a replacement kit for a luminaire, typically a failing luminaire or a luminaire requiring maintenance, which allows for an accurate preparation of the replacement kit. Another object of embodiments of the invention is to provide a method for performing quality control of a luminaire in an accurate and fast manner.

According to a fourth aspect of the invention, there is provided a method for preparing a replacement kit for a luminaire, typically a failing luminaire or a luminaire requiring maintenance, said luminaire comprising a housing and a light source arranged in the housing. The method comprises:
during manufacturing of a luminaire, taking one or more images, said one or more images comprising at least an image of an interior part of the housing;
after installation of said luminaire in the field, upon failure of the luminaire or when performing maintenance of the luminaire, preparing a replacement kit for the luminaire using the one or more images and/or a digital dataset based on the one or more images.

By taking one or more images during manufacturing, i.e. during assembly of the luminaire, said one or more images comprising at least an image of an interior part of the housing, even after many years, the details about the internal structure of the luminaire can be easily consulted. This allows preparing a replacement kit in a very accurate manner, wherein any required components can be easily derived, either directly from the one or more images, or indirectly via an intermediate digital dataset based on the one or more images. Thus, the maintenance of luminaires can take place in a faster and more efficient manner. It is noted that maintenance may refer to any kind of maintenance, e.g. the upgrading of a component of the luminaire, the replacement of a component likely to fail in the future, or any other maintenance that may be required.

It is noted that the term luminaire may refer to a luminaire head or a luminaire module with a housing in which a light source is included, and does not require the presence of a pole or other fixation base. Preferred embodiments relate to a luminaire head or module of an outdoor luminaire By outdoor luminaire, it is meant luminaires which are installed on roads, tunnels, industrial plants, campuses, stadiums, airports, harbours, rail stations, parks, cycle paths, pedestrian paths or in pedestrian zones, for example, and which can be used notably for the lighting of an outdoor area, such as roads and residential areas in the public domain, private parking areas, access roads to private building infrastructures, etc. For example, the luminaire may be a luminaire head intended for being fixed to a pole (post-top or side-entry), but the luminaire may also be luminaire module intended to be included in a modular luminaire system where multiple pole modules are arranged one above the other.

Preferably, the one or more images comprise at least two, preferably at least three, more preferably at least ten images. In further developed embodiments a large number of images may be used, e.g. more than ten, more than twenty or even more than a hundred images. Depending on the complexity of the luminaire the number of images may be increased.

Preferably, the one or more images comprise one or more photographic images. Preferably, the one or more images comprise one or more coloured images. By using a coloured image components and connections can be recognised more easily in the image. Especially for wires and cables, it is useful be able to recognise the colour of a wire or cable in the image.

Preferably, the method comprises building a digital dataset based on the one or more images, and using said digital dataset for preparing the replacement kit. In other words the one or more images may be image processed in order to obtain a digital dataset which represents any relevant parts of the luminaire. For example, the building of a digital dataset may include the building of a three dimensional (3D) model of at least a portion of the luminaire, e.g. of the entire luminaire head. Such 3D model may be built using photogrammetry techniques. For example, the three-dimensional model may allow inspecting the interior of a luminaire head or luminaire module by navigating in the 3D model. In that manner any components and connections within the housing can be inspected in a convenient manner, wherein it is possible to look from different viewpoints to the components.

It is noted that the building of a digital dataset may also take into account other data besides the one or more images, such as technical drawings of the housing and any components linked to the housing, one or more datasheets of one or more components of the luminaire, a 3D scan of the housing or of one or more components of the luminaire, etc. For example, when building the digital dataset, a user may be provided with an interface allowing him to add datasheets to the digital dataset. Alternatively, a computer means may determine automatically, based on the one or more images, using e.g. image recognition techniques, which components are included and may search automatically for the correct data sheets in a searchable database and/or on the internet. The computer means may thus in an automatic manner include datasheets in the digital dataset. If the digital dataset comprises a 3D-model of the luminaire, then the datasheets may be linked to the components in the 3D-model such that a user can visualize a datasheet e.g. by pointing at or clicking on a component in the 3D-model.

Preferably, the preparing of a replacement kit comprises determining a cause of current or future failure, determining one or more components associated with the cause of current or future failure using the one or more images and/or the digital dataset, and including said determined one or more components in the replacement kit. It is noted that the determining of the one or more components associated with the cause of current or future failure may be done by using directly the one or more images or by using the digital dataset built based on the one or more images. The determining of the cause may be based e.g. on any one or more of the following: data sensed by the luminaire, predictive or diagnostic data e.g. based on previous failures of similar luminaires, the one or more images, data captured by a mobile terminal when checking a status of a luminaire. For example, based on data about failures in similar luminaires in the past, it may be determined what a likely cause of failure may be for a more recent luminaire, and next, a suitable replacement kit may be determined for the more recent luminaire. Also, based on sensed data, e.g. a sensed energy consumption of the luminaire, a sensed temperature, a sensed light intensity, a sensed number of power cut-offs, a sensed number of surges, etc., it may be determined that a luminaire needs maintenance, and using the one or more images (either directly or via the built digital dataset), any components or connection means to be included in the replacement kit may be determined. Indeed, one of the sensed parameters above or a combination thereof may be an indication that one or more components are malfunctioning. For example, if the energy consumption does not correspond with an expected consumption based on a set dimming profile, it may be determined that the driver and/or the light source does not function correctly. Another sensed parameter may then be able to tell whether it is the driver and/or the light source that needs replacement. Next, if for example the driver needs replacement, the one or more images and/or the digital dataset will allow preparing a replacement kit e.g. including a replacement driver and any required wiring.

Preferably, the one or more images are taken at different stages during the manufacturing of the luminaire. In that manner, an accurate digital dataset can be built on the basis of the different images. More in particular, the one or more images may comprise an image before a component is mounted and after it is mounted, such that also any covered areas can be taken into account. Also, when a first component covers a second component, the one or more images may comprise an image before the first component is mounted and after it is mounted.

Preferably, the one or more images comprise images of the inside and the outside of the luminaire. In that manner, a digital dataset can be built modelling both the interior and the exterior of the luminaire.

In an exemplary embodiment, the housing of the luminaire is provided with one or more components which are electrically and/or mechanically connected via one or more electrical and/or mechanical connections, and the one or more images comprise one or more images of the one or more electrical and/or mechanical connections. The connections may be e.g. an interconnection between the components, or a connection connecting a component to the housing, or a connection connecting a component to another component. The one or more images of the one or more connections may be useful e.g. when a component needs to be replaced with a similar but non-identical component for which the interconnections have to be changed, or when one or more electrical and/or mechanical connections are subject to failure.

In an exemplary embodiment, the housing of the luminaire is provided with one or more components, and the one or more images comprise one or more images of the one or more components. The one or more components may be arranged in or on the housing or may be coupled or associated otherwise with the housing. For example the manufactured luminaire may comprise a luminaire head with a number of components in the housing, and optionally one or more components on the housing or one or more separate components, to be mounted when installing the luminaire, e.g. in or on a pole of the luminaire. In some embodiment a plurality of components may be grouped on a gear unit, such as a gear plate or gear tray, and the gear unit may be included as a whole in the housing of the luminaire. In such an embodiment, one or more images of the gear unit may be taken. An example of an embodiment with a gear unit is disclosed in European patent application EP 3 537 029 A1 or in Dutch patent application NL2023431 in the name of the applicant, which are enclosed herein by reference.

In an exemplary embodiment, the one or more components comprise one or more of the following: the light source, such as a plurality of light emitting diodes, a driver configured to drive the light source, a controller configured to control the driver and optionally one or more other components, a printed circuit board, a fuse, a surge protection device (SPD), an electrostatic discharge (ESD) protection, a connection module for interconnecting different components, a sensor, a communication module. An example of a connection module which may be included in a luminaire is described in PCT/EP2020/051533 in the name of the applicant, which is included herein by reference. The sensor may be a sensor sensing environmental data. Examples of a sensor which may be included are a movement sensor, a light sensor, an image sensor, a radar sensor, a sound sensor, a voice recorder, a pollutant sensor, a microphone, a detector of $CO_2$, $NO_x$, smoke, etc. More generally any kind of functional circuitry may be included in the luminaire such as:

power management circuitry preferably configured to manage the provision of power to one or more light sources of one or more luminaires, preferably at least three lamp posts, e.g. more than ten lamp posts; examples of power management circuitry comprise e.g. one or more of: a power meter, a fuse, a line protection, a circuit breaker, an electrical connection for multiple power lines, a clock, an astroclock, a power supply module, an PLC, a computer, a communication module, display circuitry, etc.;

telecommunication and/or networking circuitry for wired and/or wireless communication, which can comprise at least one of: an optical fiber connection, a fiber to copper interface, a fiber patch panel, a modem, a router, a switch, a patch panel, a network video recorder (NVR), a computer;

audio system management circuitry which can comprise at least one of: an amplifier, a transformer, a media player (connected to network or not), electrical connections for multiple loudspeaker lines, a computer;

WiFi circuitry, wherein an antenna for receiving WiFi signals may be integrated either in the functional module or in a separate antenna module as in the exemplary embodiment described above;

charger circuitry, e.g. phone/computer/tablet charger circuitry or vehicle charger circuitry or UAV charger circuitry (such as drone charger circuitry);

a human interface device (HID) and the associated circuitry, e.g. a camera, a loudspeaker, a button, a display, etc.

a signaling device, e.g. a light ring capable of performing signaling;

a mechanical and/or electrical plug-in device, e.g. a universal plug-in module, e.g. a mechanical device to fix a flag, a waste bin, etc.

The plurality of images may further include one or more images of any one of the components above if present in the luminaire.

In a typical embodiment, the luminaire comprises a driver configured to drive the light source and wiring connected to the driver, and the one or more images comprises at least an image of the driver and the wiring connected to the driver. As a driver is a component which is typically prone to failure after a couple of years and as driver versions may vary rapidly, a driver is often not replaced by exactly the same driver. By including an image of the driver and the wiring connected to the driver, it can be checked if a new wiring is required to be included in the replacement kit containing the replacement driver.

In an exemplary embodiment, the housing is provided with one or more components fixed with fixation means such as screws, rivets, clips, clamping means, etc., and the one or more images comprises one or more images of the fixation means.

In a preferred embodiment, during the assembly, the luminaire is placed in an area including one or more visually discernible references located at a known location. Alternatively or in addition, one or more visually discernible references may be added to the housing and/or to one or more components provided to the housing. The one or more images may include one or more images comprising the one or more references. The digital dataset may be built using the one or more references and/or the one or more references may be used to link different images to each other and/or to determine dimensions within an image. Further, the references in the images may be used when performing quality control to determine if components are correctly positioned. For example, a reference may be provided on an optical element and this reference may be used to determine if the optical element is correctly positioned with respect to the light source. The reference may have any 2D or 3D shape, e.g. the shape of a dot, a line, a polygon, a cuboid, etc.

In an exemplary embodiment, the one or more images and/or the digital dataset is associated with a unique identification of the luminaire. The method may then further comprise the step of providing the luminaire with a readable identification means configured to allow an operator to read the identification of the luminaire using a mobile terminal when in the vicinity of the luminaire. Using the read identification, an operator may thus obtain the associated one or more images or the associated digital dataset. This may allow an operator to see the interior of the luminaire e.g. before installing any components included in the replacement kit.

Additionally, one or more images may be captured after installation. The one or more images may be added to the one or more images or to the digital dataset already associated to the readable identification, e.g. by registering the captured one or more images on a remote server. Optionally, other information may be inputted and associated to the unique identification of the luminaire. In an embodiment, a passer-by may obtain the unique identification, e.g. by scanning a QR code, of the luminaire and signal an issue with this luminaire; the issue may be associated to the unique identification and one or more suggestions for a replacement kit may be stored in association with the unique identification.

The identifications of a plurality of luminaires (e.g. a plurality of luminaires of a luminaire network) may be registered on a remote server and the operator may have access to the one or more images and/or to the digital dataset of each luminaire of the plurality of luminaires. The operator may have access to the remote server and may be able to consult the one or more images and/or to the digital dataset without having to go to the luminaire, in order to prepare a suitable replacement kit. For example, the operator could see on the screen a map with the plurality of luminaires and an indication that one luminaire has failed. Then by clicking on the identified luminaire in the map he could get access to the one or more images and/or to the digital dataset allowing him to order a suitable replacement kit.

It is noted that even for the same type of luminaires, different identifications are stored. In that regard it is noted that the way the components are arranged and/or connected may be slightly different for luminaires manufactured on the same line due to e.g. different assembly personnel, etc.

In a possible embodiment, the step of preparing a replacement kit comprises preparing replacement instructions using the one or more images and/or the digital dataset. In other words, using the one or more images and/or the digital dataset, replacement instructions may be prepared which are tailored for the specific luminaire. The replacement instructions may comprise images, preferably a video, made using the one or more images and/or the digital dataset. For example, an instruction video may be prepared using the 3D model of the luminaire, showing step by step in 3D what needs to be done. According to another example, an instruction manual in 2D may be prepared using the one or more images. It is noted that the replacement kit does not need to include any physical components and could also be only a digital instruction manual. An alternative embodiment could be an augmented reality approach. The operator could read the readable identification means, e.g. scan a QR code, at the luminaire site and then direct a camera of the mobile terminal towards the inside of the luminaire, whereupon the mobile terminal could provide live step-by-step instructions, e.g. on top of the real image of the interior of the luminaire.

The mobile terminal may be a mobile phone, a tablet, a wearable connected device like connected glasses, and more generally any mobile computing means.

According to a further developed embodiment, the method may further comprise performing quality control based on the one or more images and/or the digital dataset. This performing of quality control may be done in addition to the use of the one or more images and/or the digital dataset for preparing a replacement kit, or it may be done separately as will be further discussed below in connection with the second aspect of the invention.

According to a possible embodiment, the method further comprises maintaining a database of previously prepared replacement kits, and preparing the replacement kit using information from the database. For example, when it is determined that the one or more images and/or the digital dataset are sufficiently similar to the one or more images and/or the digital dataset of another luminaire for which a replacement kit was prepared previously, it may be decided to use the same replacement kit.

According to a fifth aspect of the invention, there is provided a method for performing quality control of an assembled luminaire comprising a housing and a light source arranged in the housing. The method comprises:

during manufacturing of the luminaire, taking one or more images, said one or more images comprising at least an image of an interior part of the housing;

performing a quality control of the assembled luminaire based the one or more images and/or a digital dataset built based on the one or more images.

By taking one or more images during assembly of the luminaire, said one or more images comprising at least an image of an interior part of the housing, quality control can be done in an accurate manner, either by an operator checking on a screen or automatically using image processing techniques and/or artificial intelligence, without having to physically inspect the luminaire. Optionally, some functional tests may also be avoided.

Preferably, the one or more images comprise at least two, preferably at least three, more preferably at least ten images. In further developed embodiments a large number of images may be used, e.g. more than ten, more than twenty or even more than a hundred images. Depending on the complexity of the luminaire the number of images may be increased.

Preferably, the one or more images comprise one or more photographic images. Preferably, the one or more images comprise one or more coloured images. By using a coloured image components and connections can be recognised more easily in the image. Especially for wires and cables, it is useful be able to recognise the colour of a wire or cable in the image. When performing quality control, this will allow recognising if the connection between the components is correct.

Preferably, the method comprises building a digital dataset based on the one or more images; and using said digital dataset for performing the quality control. In other words the one or more images may be image processed in order to obtain a digital dataset which represents any parts of the luminaire for which quality control is required. For example, the building of a digital dataset may include the building of a three dimensional (3D) model of at least a portion of the luminaire, e.g. one or more parts which are important for quality control. For example, the three-dimensional model may allow inspecting the interior of a luminaire head or luminaire module by "moving around" in the 3D model. In that manner any components and connections subject to quality control can be inspected in a convenient manner, wherein it is possible to look from different viewpoints to the components.

In an exemplary embodiment, the housing of the luminaire is provided with components which are electrically interconnected by wiring, and the one or more images comprise one or more images of the wiring. The performing of a quality control may then comprise checking if the wiring is correct.

In an exemplary embodiment, the housing of the luminaire is provided with one or more components which are fixed by fixation means, and the one or more images comprise one or more images of the fixation means, wherein the performing of a quality control comprises checking if the fixations means are present and/or are arranged in a correct manner. For example, using image recognition techniques, fixations means such as screws may be located in an image or in a 3D-model, and the number of screws may be counted to check if all required screws are present.

The one or more components may be any one or more of the components mentioned above in connection with the fourth aspect.

The step of performing of a quality control may comprise checking one or more components and/or connection means such as fixation means and/or wirings in the one or more images and/or in the digital dataset using image recognition software.

Preferably, the step of taking one or more images is repeated for a series of luminaires manufactured on the same line. The step of performing of a quality control may then comprise comparing captured images and/or digital datasets of the series of luminaires and detecting deviations between the images and/or digital datasets of the series of luminaires and/or using artificial intelligence to analyse the one or more images and/or digital datasets of the series of luminaires. For example, if for a series of more than twenty luminaires, a minority thereof has deviating images, then it may be decided that only this minority has to be further checked.

In an exemplary embodiment, the using of artificial intelligence to analyse the one or more images and/or the digital datasets of the series of luminaires comprises:
  in a first testing phase, for a first series of luminaires, testing the functioning of a luminaire, and associating the functioning with the one or more images and/or the digital datasets;
  using a self learning system, determining one or more image analysis criteria for the one or more images and/or the digital dataset which can be used to check if a luminaire functions correctly;
  in a second operational phase, for a second series of luminaires, performing quality control using for the second series of luminaires the one or more images and/or the digital dataset in combination with the determined one or more image analysis criteria, preferably without testing the functioning of the second series of luminaires.

For example, at the beginning of the production, the manufactured luminaires may be tested after assembly and the test results may be linked to the associated one or more images of each luminaire or to the associated digital datasets. An artificial intelligence system (using machine learning) may learn from the images which criteria are useful to check in the images to determine if a luminaire fulfils the required standards. Once those criteria have been determined, the testing may be omitted and the system may determine whether a luminaire fulfils the required standards based on the one or more images of the luminaire taken during manufacturing and/or on the digital dataset, using the determined criteria.

Optionally, any one of the steps described above in connection with the fourth aspect of the invention, may also be included in the fifth aspect.

According to a further aspect of the invention, there is provided a computer program comprising computer-executable instructions to perform, when the program is run on a computer, a method comprising:
  receiving one or more images taken during manufacturing of a luminaire, said one or more images comprising at least an image of an interior part of the housing;
  determining one or more components to be included in a replacement kit and/or preparing replacement instructions to be included in a replacement kit for the luminaire using the one or more images and/or a digital dataset based on the one or more images; and/or performing a quality control using the one or more images and/or a digital dataset based on the one or more images.

In an exemplary embodiment, the performed method further comprises determining a cause of current or future failure, and the step of determining comprises determining one or more components associated with the cause of current or future failure using the one or more images and/or the digital dataset.

Preferably, the method further comprises building a digital dataset, preferably a three dimensional model of at least a portion of the luminaire, based on the one or more images and using said digital dataset in the step of determining one or more components to be included in a replacement kit and/or preparing replacement instructions to be included in a replacement kit and/or performing quality control.

Optionally, the method further comprises controlling any one of the steps of the method according to any one of the embodiments described above.

According to a further aspect of the invention, there is provided a computer device or other hardware device programmed to perform or control one or more steps of any one of the embodiments of the method disclosed above. According to another aspect there is provided a data storage device encoding a program in machine-readable and machine-executable form to perform or control one or more steps of any one of the embodiments of the method disclosed above.

Further embodiments of the invention are also defined by the following clauses.

1. A method for preparing a replacement kit for a luminaire, typically a failing luminaire or a luminaire requiring maintenance, said luminaire comprising a housing and a light source arranged in the housing, said method comprising:
   during manufacturing of a luminaire, taking one or more images, said one or more images comprising at least an image of an interior part of the housing;
   after installation of said luminaire in the field, upon failure of the luminaire or when performing maintenance of the luminaire, preparing a replacement kit for the luminaire using at least one of:
   the one or more images and
   a digital dataset based on the one or more images.

2. The method of clause 1, wherein the one or more images comprise at least two, preferably at least three, more preferably at least ten images.

3. The method of any one of the previous clauses, wherein the one or more images are photographic images, preferably coloured photographic images.

4. The method of any one of the previous clauses, further comprising building a three dimensional model of at least a portion of the luminaire based on the one or more images, and using said three dimensional model as the digital dataset.

5. The method of any one of the previous clauses, wherein the preparing of a replacement kit comprises determining a cause of current or future failure, and determining one or more components to be included in the replacement kit associated with the cause of current or future failure using the one or more images and/or the digital dataset.

6. The method of the previous clause, wherein the determining of the cause is based on any one or more of the following: data sensed by the luminaire, predictive or diagnostic data, the one or more images, the digital dataset.

7. The method of any one of the previous clauses, wherein the one or more images is taken at different stages during the manufacturing of the luminaire.

8. The method of any one of the previous clauses, wherein the one or more images comprise images of the inside and the outside of the luminaire.

9. The method of any one of the previous clauses, wherein the housing of the luminaire is provided with one or more components which are electrically and/or mechanically connected via one or more electrical and/or mechanical connections, and wherein the one or more images comprise one or more images of the one or more electrical and/or mechanical connections.

10. The method of any one of the previous clauses, wherein the housing of the luminaire is provided with one or more components, and wherein the one or more images comprise one or more images of the one or more components.

11. The method of clause 9 or 10, wherein the one or more components comprise one or more of the following: the light source, a driver configured to drive the light source, a controller configured to control the driver, a printed circuit board, a fuse, a surge protection device, an electrostatic discharge protection, a connection module, a sensor, a communication module.

12. The method of any one of the previous clauses, wherein the luminaire comprises a driver configured to drive the light source and wiring connected to the driver, and wherein the one or more images comprises an image of the driver and the wiring connected to the driver.

13. The method of any one of the previous clauses, wherein during the manufacturing the luminaire is placed in an area including one or more visually discernible references, R, located at a known location, and/or wherein one or more visually discernible references are added to the housing and/or to one or more components provided to the housing, wherein the one or more images include one or more images comprising the one or more references, wherein the digital dataset is built using the one or more references.

14. The method of any one of the previous clauses, wherein the one or more images and/or the digital dataset is associated with an identification of the luminaire.

15. The method of the previous clause, further comprising providing the luminaire with a readable identification means configured to allow an operator to read the identification of the luminaire using a mobile terminal when in the vicinity of the luminaire.

16. The method of any one of the previous clauses, wherein the step of preparing the replacement kit comprises preparing replacement instructions using the one or more images and/or the digital dataset.

17. The method of the previous clause, wherein the replacement instructions comprise images, preferably a video, made using the one or more images and/or the digital dataset.

18. The method of any one of the previous clauses, further comprising performing quality control based on the one or more images and/or the digital dataset.

19. A method for performing quality control of an assembled luminaire comprising a housing and a light source arranged in the housing, said method comprising:
   during manufacturing of the luminaire, taking one or more images, said one or more images comprising at least an image of an interior part of the housing;
   performing a quality control of the assembled luminaire based on at least one of:
   the one or more images and
   a digital dataset based on the one or more images.

20. The method of the previous clause, wherein the one or more images comprise at least two, preferably at least three, more preferably at least ten images.

21. The method of clause 20 or 21, wherein the one or more images are one or more photographic images, preferably coloured photographic images.

22. The method of any one of the clauses 19-21, further comprising building a three dimensional model of at least a portion of the luminaire based on the one or more images, and using said three dimensional model as the digital dataset.

23. The method of any one of the clauses 19-22, wherein the housing of the luminaire is provided with components which are electrically interconnected by wiring, and wherein the one or more images comprises one or more images of the wiring, wherein the performing of a quality control comprises checking if the wiring is correct.

24. The method of any one of the clauses 19-23, wherein the housing of the luminaire is provided with one or more components which are fixed by fixation means, and wherein the one or more images comprises one or more images of the fixation means, wherein the performing of a quality control comprises checking if the fixations means are present and/or are arranged in a correct manner.

25. The method of any one of the clauses 19-24, wherein the one or more images and/or the digital dataset is associated with an identification of the luminaire.

26. The method of the previous clause, further comprising providing the luminaire with a readable identification means configured to allow an operator to read the identification of the luminaire using a mobile terminal when in the vicinity of the luminaire.

27. The method of any one of the clauses 19-26, wherein the step of performing of a quality control comprises checking one or more components and/or connection means and/or fixations means and/or wiring in the one or more images and/or in the digital dataset using image recognition techniques.

28. The method of any one of the clauses 19-27, wherein the step of taking one or more images during manufacturing of a luminaire, is repeated for a series of luminaires manufactured on the same manufacturing line.

29. The method of the previous clause, wherein the step of performing of a quality control comprises any one or more of the following: comparing the one or more images and/or the digital datasets of each luminaire of the series of luminaires and detecting deviations between the images and/or digital datasets of the series of luminaires, using artificial intelligence to analyse the one or more images and/or the digital datasets of the series of luminaires.

30. The method of the previous clause, wherein the using of artificial intelligence to analyse the one or more images and/or the digital datasets of the series of luminaires comprises:
  in a first testing phase, for a first series of luminaires, testing the functioning of a luminaire, and associating the functioning with the one or more images and/or the digital datasets;
  using a self learning system, determining one or more image analysis criteria for the one or more images and/or the digital dataset which can be used to check if a luminaire functions correctly;
  in a second operational phase, for a second series of luminaires, performing quality control using for the second series of luminaires the one or more images and/or the digital dataset in combination with the determined one or more image analysis criteria, preferably without testing the functioning of the second series of luminaires.

31. The method of any one of the clauses 19-30, wherein during the manufacturing the luminaire is placed in an area including one or more visually discernible references (R) located at a known location, and/or wherein one or more visually discernible references are added to the housing and/or to one or more components provided to the housing, wherein the one or more images include one or more images comprising the one or more references, wherein performing the quality control comprises checking the one or more references in the one or more images and/or in the digital dataset.

32. A computer program comprising computer-executable instructions to perform, when the program is run on a computer, a method comprising:
  receiving one or more images taken during assembly of a luminaire, said one or more images comprising at least an image of an interior part of the housing;
  determining one or more components to be included in a replacement kit and/or preparing replacement instructions to be included in a replacement kit for the luminaire using the one or more images and/or a digital dataset based on the one or more images; and/or performing a quality control using the one or more images and/or a digital dataset based on the one or more images.

33. The computer program of the previous clause, wherein the method comprises determining a cause of current or future failure, and wherein the step of determining comprises determining one or more components associated with the cause of current or future failure using the one or more images and/or the digital dataset.

34. The computer program of clause 32 or 33, wherein the method further comprises building the digital dataset, preferably a three dimensional model of at least a portion of the luminaire, based on the one or more images and using said digital dataset in the step of determining one or more components to be included in a replacement kit and/or preparing replacement instructions to be included in a replacement kit and/or performing a quality control.

35. The computer program of any one of clauses 32-35, wherein the method further comprises controlling any one of the steps of the method according to any one of the clauses 1-31.

BRIEF DESCRIPTION OF THE FIGURES

This and other aspects of the present invention will now be described in more detail, with reference to the appended drawings showing a currently preferred embodiment of the invention. Like numbers refer to like features throughout the drawings.

DESCRIPTION OF EMBODIMENTS

Figure 1:
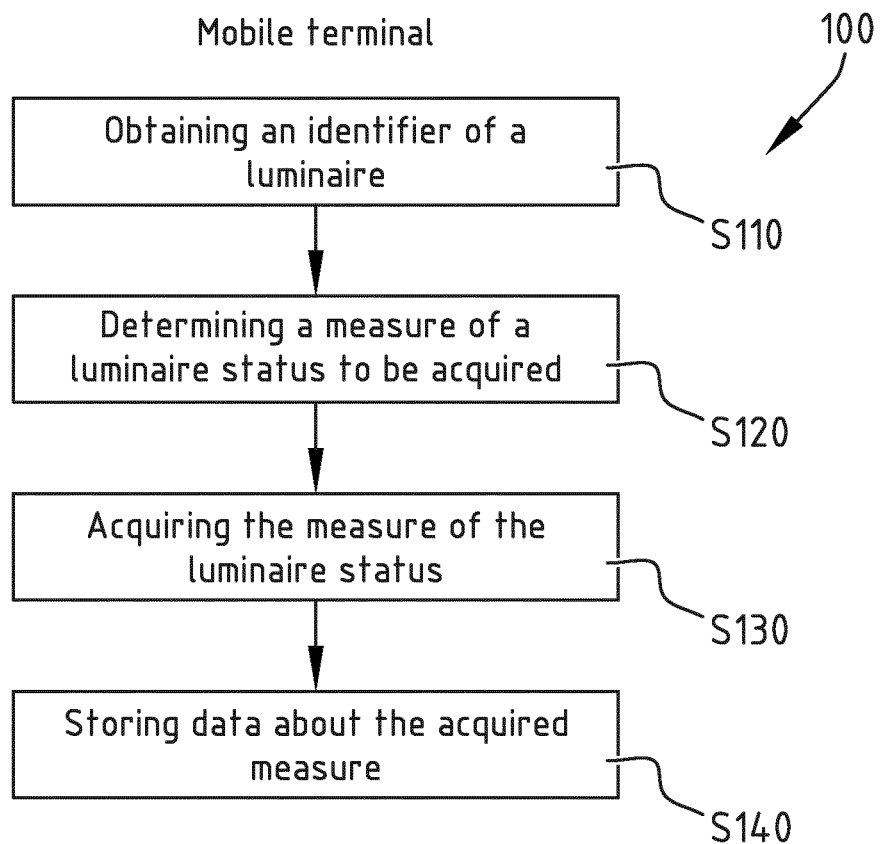
FIG. 1 schematically illustrates an exemplary embodiment of a method for checking a status of a luminaire according to the invention.

FIG. 1 schematically illustrates an exemplary embodiment of a method for checking a status of a luminaire according to the present invention. The method is to be applied in a mobile terminal. The mobile terminal is used in a vicinity of the luminaire.

The luminaire may comprise a main lighting unit and optionally a functional module. In an embodiment, the main lighting unit and optionally the functional module may be incorporated in a luminaire head of the luminaire. In another embodiment, the functional module may be separated from the luminaire head of the luminaire. The luminaire may comprise one or more luminaire heads. The functional module may comprise functional circuitry. Examples of functional circuitry which may be included in the functional module may be any one or more of the following:

base station circuitry;
power management circuitry comprising, e.g. one or more of: a power meter, a fuse, a line protection, a circuit breaker, an electrical connection for multiple power lines, a clock, an astroclock, a power supply module, an PLC, a computer, a communication module, display circuitry, etc.; preferably the power management circuitry is configured to manage the provision of power to multiple luminaires, preferably at least three luminaires, e.g. more than ten luminaires. In such embodiments power connection cables pass from the functional module through a support of the luminaire to other luminaires, e.g. underground;
telecommunication circuitry which can comprise at least one of: an optical fiber connection, a fiber to copper interface, a fiber patch panel, a modem, a router, a switch, a patch panel, a network video recorder (NVR), a computer;
audio system management circuitry which can comprise at least one of: an amplifier, a transformer, a media player (connected to network or not), electrical connections for multiple loudspeaker lines, a computer;
WiFi circuitry, wherein an antenna for receiving WiFi signals may be integrated either in the functional module or in a separate antenna module as in the exemplary embodiment of the luminaire with a base station module;
charger circuitry, e.g. phone charger circuitry or vehicle charger circuitry;
an environmental sensor such as a microphone, or a detector of $CO_2$, $NO_x$, smoke, etc., and the associated circuitry;
a human interface device (HID) and the associated circuitry, e.g. a camera, a loudspeaker, a button, etc.

The mobile terminal comprises a sensing means, a communication means, a controlling means, and a memory. Detailed embodiments of a system including the mobile terminal and the luminaire will be described with respect to FIG. 4. Additionally the system may further comprise a remote terminal. The remote terminal may be a terminal, said terminal including a communication means, a processing means, and a memory, located at a distance from the luminaire and being apt for communicating with the luminaire, e.g. another luminaire, another mobile terminal, a remote server. Preferably the remote terminal is a remote server for centrally handling a plurality of luminaires, preferably in a luminaire network.

In a first step S110 there is an obtaining, by the mobile terminal, of an identifier of the luminaire. The identifier may be a unique attribute of the luminaire. The identifier may be of different kinds and represented in a physical form, e.g. serial number, barcode, symbol, or obtainable electronically, e.g. RFID tag, geo-localization position. Depending on the kind of the identifier, step S110 may be divided in a plurality of sub-steps.

In an embodiment, the identifier is a visual representation, e.g. a QR code, on a surface in proximity of the luminaire and step S110 may comprise: acquiring, via an image capturing means of the mobile terminal, the visual representation of the identifier; and obtaining, by the mobile terminal, the identifier of the luminaire based on the acquired visual representation. The determining of the identifier of the luminaire based on the acquired visual representation may be done by a processing means of the mobile terminal. Alternatively, the mobile terminal may transmit, via the communication means of the mobile terminal, the visual representation of the identifier to the remote terminal, and then receive, from the remote terminal, the identifier based on the visual representation. In another embodiment, the identifier of the luminaire may be a geo-localization position of the luminaire obtained by a geo-localization means of the mobile terminal. The skilled person will understand that numerous means can be implemented to assign a unique identifier to the luminaire and then obtain it using the mobile terminal.

In addition, another identifier of the luminaire may be obtained by the mobile terminal. The another identifier may be of a similar kind or of a different kind than the identifier of the luminaire. The another identifier may correspond to a subpart of the luminaire, e.g. the luminaire head, a driving means of the luminaire, one of the functional modules of the luminaire.

In a second step S120, there is a determining, based on the obtained identifier of the luminaire, of a measure of the status of the luminaire to be acquired. Detailed embodiments of the determining of the measure of the luminaire status will be described with respect to FIGS. 2A and 2B. In brief, obtaining the identifier by the mobile terminal is the first step to be performed, based upon which the specific status or statuses of the luminaire are determined, for example by receiving said status or statuses requiring acquisition from a remote terminal have transmission of the obtained identifier to said remote terminal or retrieving said status or statuses requiring acquisition from an internal memory of the mobile terminal. By luminaire status, it is meant a measurable characteristic characterizing the luminaire, an environment of the luminaire, or a subpart of the luminaire. For example, the measurable characteristic of the luminaire may be any one of, but not limited to: angular positioning of a luminaire head of the luminaire, geo-localization of the luminaire, arrangement of the electronic components in the luminaire head of the luminaire, connectivity of a communication unit of the luminaire, sound level in the surrounding environment of the luminaire, amount of light at a time of the day in proximity of the luminaire, light distribution of the luminaire head of the luminaire, status of an electronic component being part of the luminaire, ambient temperature, etc. In the context of the present invention, applying the method in the mobile terminal in the vicinity of the luminaire may be understood as providing the mobile terminal at a distance from the luminaire allowing to acquire a representative measure of the desired luminaire status.

In a third step S130, there is an acquiring, by the sensing means of the mobile terminal, of the measure of the luminaire status. The acquiring of the measure may be dependent on the kind of the sensing means of the mobile terminal. The sensing means of the mobile terminal may be at least one of: an accelerometer, an image capturing means, a light sensing means, a sound capturing means, a geo-localization means, a temperature sensing means, an antenna, a motion sensor, a pollution sensor, a visibility sensor, a radar sensor. The acquiring of the measure may include one or more manipulation of the mobile terminal and/or of the luminaire. For example, in an embodiment, the luminaire may include the luminaire head, the sensing means of the mobile terminal may comprise an accelerometer, and the acquiring of the measure of the luminaire status may comprise the steps of: providing the mobile terminal to a predetermined surface of the luminaire head; and acquiring, via the accelerometer of the mobile terminal, a measure for at least one tilt angle representative for an angular positioning of the luminaire head. In another embodiment, acquiring the measure may require measurements from more than one sensing means to be fully obtained or may require a manual entry on the mobile terminal by a field operator. Additionally or alternatively, a similar measure as the required measure may be available in the memory of the mobile terminal or in the remote terminal and acquiring the measure may allow to complement or detract the available similar measure.

In a fourth step S140, there is a storing, in the memory of the mobile terminal, of data about the acquired measure of the luminaire status, said data being associated to the identifier of the luminaire Additional data may be joined when storing data about the acquired measure associated to the identifier, e.g. a time stamp of the checking of the luminaire status, and/or a location stamp of the checking of the luminaire status, and/or an identification of the field operator having performing the checking of the luminaire status using the mobile terminal. The memory of the mobile terminal may be a temporary memory, e.g. a buffer memory, or a long-term memory, e.g. a hard disk memory. The association of the data about the acquired measure of the luminaire status and the identifier of the luminaire may allow for a convenient sorting of the data, or in view of a further processing. In an embodiment, the measure of the luminaire status is more specifically related to a subpart of the luminaire and the subpart of the luminaire has an associated identifier which has been obtained by the mobile terminal; the mobile terminal may store the data about the acquired measure and associate it to both the identifier of the luminaire and the identifier of the subpart of the luminaire.

Figure 2A:
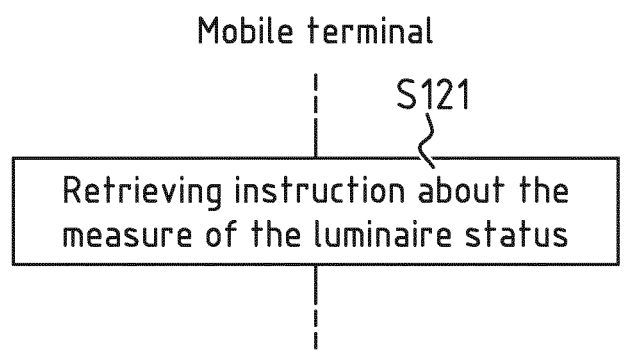
FIGS. 2A-2B schematically illustrate two alternative embodiments, respectively, of sub-steps of a method for checking a status of a luminaire according to the invention.
Figure 2B:
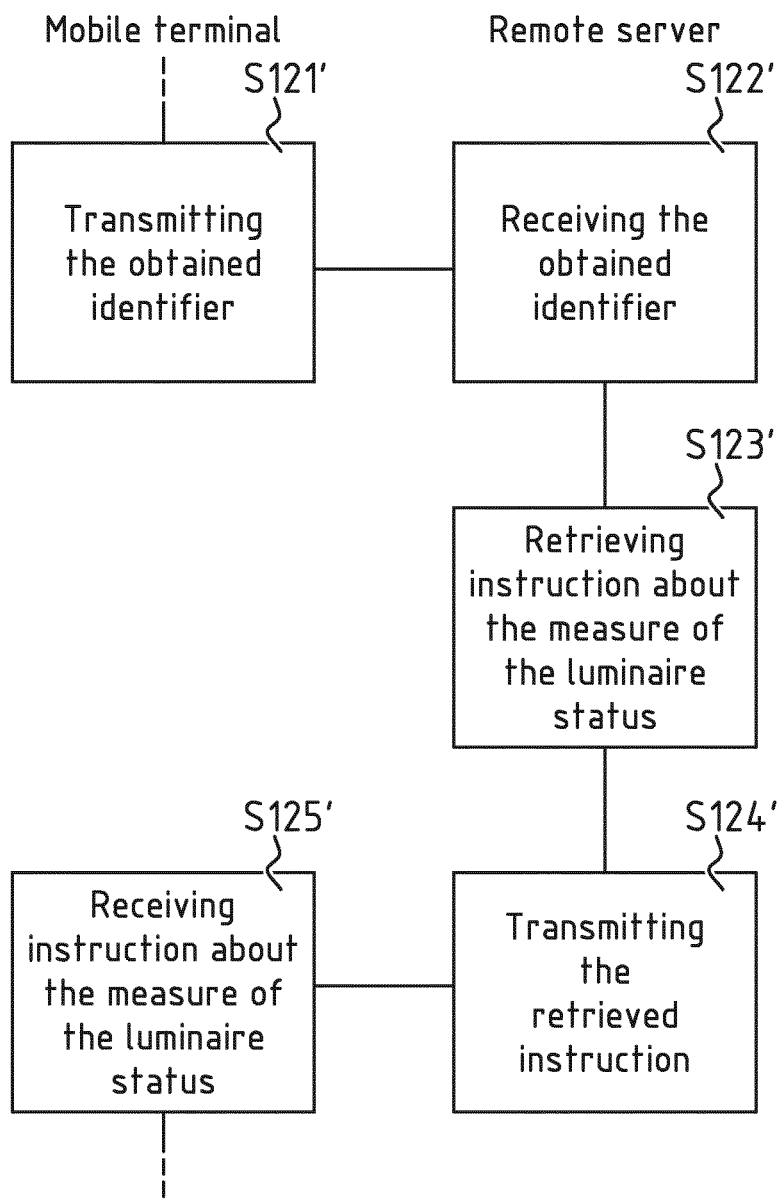

FIGS. 2A and 2B schematically illustrate two alternative embodiments, respectively, of sub-steps of a method for checking a status of a luminaire according to the present invention. FIGS. 2A and 2B illustrate sub-steps of step S120 of FIG. 1.

In a step S121, as illustrated in FIG. 2A, there is a retrieving, from the memory of the mobile terminal, of an instruction about the measure of the luminaire status to be acquired based on the obtained identifier of the luminaire. The instruction about the measure retrieved from the memory of the mobile terminal may comprise an indication about one or more measurement required in order to obtain the measure, e.g. a specific tilt angle of the luminaire head, a sound level, a light amplitude, a photo of wirings within the luminaire head, and/or may comprise one or more guideline on how to accomplish the one or more measurement required to obtain the measure.

In an embodiment, the mobile terminal may comprise a display and the retrieved instruction may correspond to a written instruction or an image-based instruction indicating how to obtain the required measure. In another embodiment, the retrieved instruction may, upon obtaining the identifier, correspond to the launch of a program on the mobile terminal allowing to perform the acquisition of the measure. In yet another embodiment, the retrieved instruction may comprise one or more guideline such as preparatory steps to be conducted with respect to the luminaire and/or the mobile terminal prior to the acquiring of the measure.

Alternatively or additionally, as illustrated in FIG. 2B, in a step S121', there is a transmitting to a remote terminal, by the communication means of the mobile terminal, of the obtained identifier of the luminaire. The mobile terminal may be communicating with the remote terminal to obtain directly what is inquired regarding the luminaire status. Communication with the remote terminal may be established wirelessly or in a wired manner Data may be sent via a wireless network operating over short-range or long-range communication, e.g. Bluetooth, Wi-Fi, Zigbee, LORA (IoT), IR, cellular, or via a wired network, e.g. Ethernet, DALI, DMX, RS485, USB.

In a step S122', there is a receiving, by a communication means of the remote terminal, of the obtained identifier. In a step S123', there is a retrieving, from a memory of the remote terminal, of an instruction about the measure of the luminaire status to be acquired based on the obtained identifier of the luminaire. In a step S124', there is a transmitting to the mobile terminal, by the communication means of the remote terminal, of the retrieved instruction. In a step S125', there is a receiving, by the communication means of the mobile terminal, of the retrieved instruction about the measure of the luminaire status to be acquired.

The steps described with respect to FIG. 2A and FIG. 2B may be executed as alternatives to one another or in complement to one another. For example, part of the instruction about the measure to be acquired may be available from the memory of the mobile terminal and another part of the instruction about the measure to be acquired may be available from the memory of the remote terminal; both the part and the another part of the instruction may be gathered such that the measure of the luminaire status to be acquired is determined.

Figure 3:
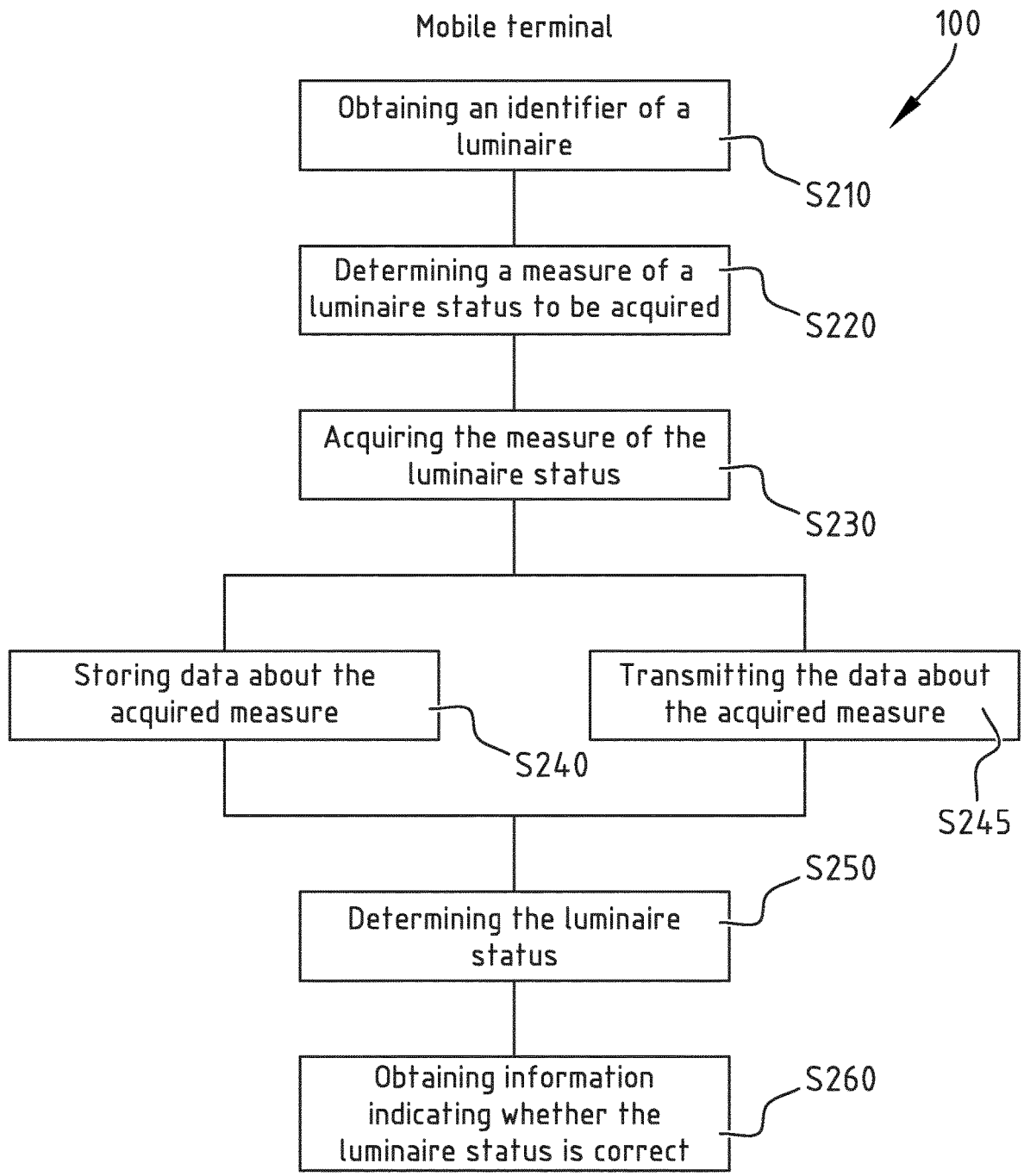
FIG. 3 schematically illustrates another exemplary embodiment of a method for checking a status of a luminaire according to the invention.

FIG. 3 schematically illustrates another exemplary embodiment of a method for checking a status of a luminaire according to the present invention. In the embodiment of FIG. 3, steps S210, S220, S230, and S240 may be similar to steps S110, S120, S130, and S140 of FIG. 1.

In a step S245, there is a transmitting, preferably to a remote terminal, by the communication means of the mobile terminal, of the data about the acquired measure of the luminaire status associated to the identifier of the luminaire. The transmitting of the data may be to the same remote terminal as for step S121' of FIG. 2B or to another remote terminal. In the embodiment of FIG. 3, the step S245 may be executed in parallel with the step S240. In another embodiment, the step S245 may be executed prior to the step S240. In yet another embodiment, the step S240 may be executed prior to the step S245.

In a step S250, there is a determining, based on the acquired measure of the luminaire status, of the luminaire status. The determining of the luminaire status based on the acquired measure may be achieved with or without processing the acquired measure in the mobile terminal and/or the remote terminal. For example, the acquired measure may serve to complement or detract an available measure and the acquired measure may be processed while taking into account the available measure.

In an embodiment, a certain amount of light may be measured by a light sensing means of the mobile terminal on the premises of the luminaire. This amount of light may be processed to remove white noise from the measured amount of light, said white noise originating from a sensor of the light sensing means, in order to obtain the luminaire status corresponding to the luminaire environmental light.

In embodiments of the luminaire comprising a photocell to control the switching of the main lighting unit, the photocell of the luminaire may have aged and there may be a need to check whether the measurement from the photocell is still accurate. To check the status of the photocell, the amount of light measured by the sensing means of the mobile terminal may be compared to the amount of light measured by the photocell. In another embodiment, the light sensing means of the mobile terminal may measure the amount of light on the premises of the luminaire to determine the background light level status of the luminaire; and the determined background light level status of the luminaire may be used to adapt the switching threshold controlled by the photocell of the luminaire.

In yet another embodiment, the field operator may capture with the mobile terminal an image of a light distribution of the luminaire on a surface to be illuminated to check the light distribution status of the main lighting unit. In still another embodiment, the field operator may capture with the mobile terminal an image of the luminaire with the main lighting unit switched on to check the mains connection status of the luminaire.

Depending on embodiments, capturing one or more images with the mobile terminal may be useful in determining a great variety of luminaire statuses. For example, it may be useful to determine an inclination/orientation status of the luminaire and its luminaire head(s). It may also be useful in determining an environment status of the luminaire surroundings. It may be useful in determining obstacle presence relative to a lighting unit of the luminaire. It may be useful in determining a wiring status or an arrangement status of components within a luminaire head of the luminaire.

The skilled person will understand that various kinds of acquired measures may be processed accordingly to determine the luminaire status. As part of the overall monitoring and supervising of a luminaire network, for example by the remote terminal, the determined luminaire status may serve as a basis for future actions.

In another embodiment, a measure for at least one tilt angle representative for an angular positioning of a luminaire head of the luminaire may be measured by an accelerometer of the mobile terminal, said mobile terminal being provided to a predetermined surface of the luminaire head. The angular positioning may be defined by one or more tilt angle, said tilt angle corresponding to a yaw angle, a pitch angle, or a roll angle of the luminaire head. The predetermined surface of the luminaire head may be a substantially flat surface configured for cooperating with a corresponding external surface of the mobile terminal, optionally with a holder configured for holding in place the mobile terminal. The predetermined surface of the luminaire head may be an external surface of the housing of the luminaire head or a surface inside the housing of the luminaire head. The predetermined surface of the luminaire head may be defined with a predetermined inclination with respect to a horizontal plane, said predetermined inclination being defined by a yaw, pitch, and/or roll angle, allowing to determine the luminaire status corresponding to the luminaire head angular positioning based on the acquired measure and taking into account the predetermined inclination of the predetermined surface.

In a step S260, there is an obtaining of information indicating whether the luminaire status is correct based on the determined luminaire status and a reference status, said information optionally comprising a required correction. To conclude whether the luminaire status is correct the determined luminaire status in step S250 may be compared to the reference status; the result of said comparison may be the basis for future actions on the luminaire More specifically, the luminaire status may be compared with the reference status, said reference status corresponding, for example, to an expected value or state of the luminaire status. Depending on the difference between the luminaire status and the reference status, the luminaire status may be estimated as correct or incorrect depending whether the luminaire status deviates out of a predetermined range away from the reference status. An indication of the luminaire status being incorrect may lead to, e.g. a maintenance operation by the field operator, the checking of another luminaire status, and/or a further action by the remote terminal. Optionally, there may be a plurality of reference statuses and the luminaire status may be characterized by a plurality of values depending on the comparison of the luminaire status with the plurality of reference statuses.

Similarly as the determining of the measure to be acquired in step S220, the obtaining of information in step S260 may rely on a retrieving of the information from the memory of the mobile terminal, or may involve a transmitting of the luminaire status to the remote terminal followed by a receiving from the remote terminal of information indicating whether the luminaire status is correct. Alternatively, the remote terminal may, upon receiving the data of the acquired measure of the luminaire status following the execution of step S245, directly transmit to the mobile terminal the information indicating whether the luminaire status is correct based on the determined luminaire status. In this case, applying the step S250 in the mobile terminal may be avoided and take place instead in the remote terminal.

In an embodiment, the mobile terminal may comprises an output means. Applying the step S260 in the mobile terminal may comprise: obtaining information comprising the required correction; and outputting, by the output means of the mobile terminal, an information correlated with the required correction. In this way, performing the steps of the method and manipulating the mobile terminal during the implementation of the method may be made easier by the assistance provided when outputting the information correlated with the required correction through the output means. The output means of the mobile terminal may comprise a display, a speaker, a vibration unit, an augmented-reality device, and/or a light source. The correlation in signal outputted by the output means with the required correction may be correlation in intensity of the signal, frequency of the signal, color of the signal, and/or spoken or written language outputted. The skilled person will understand that assistance may be provided through numerous ways to the field operator depending on the output means available.

Figure 4:
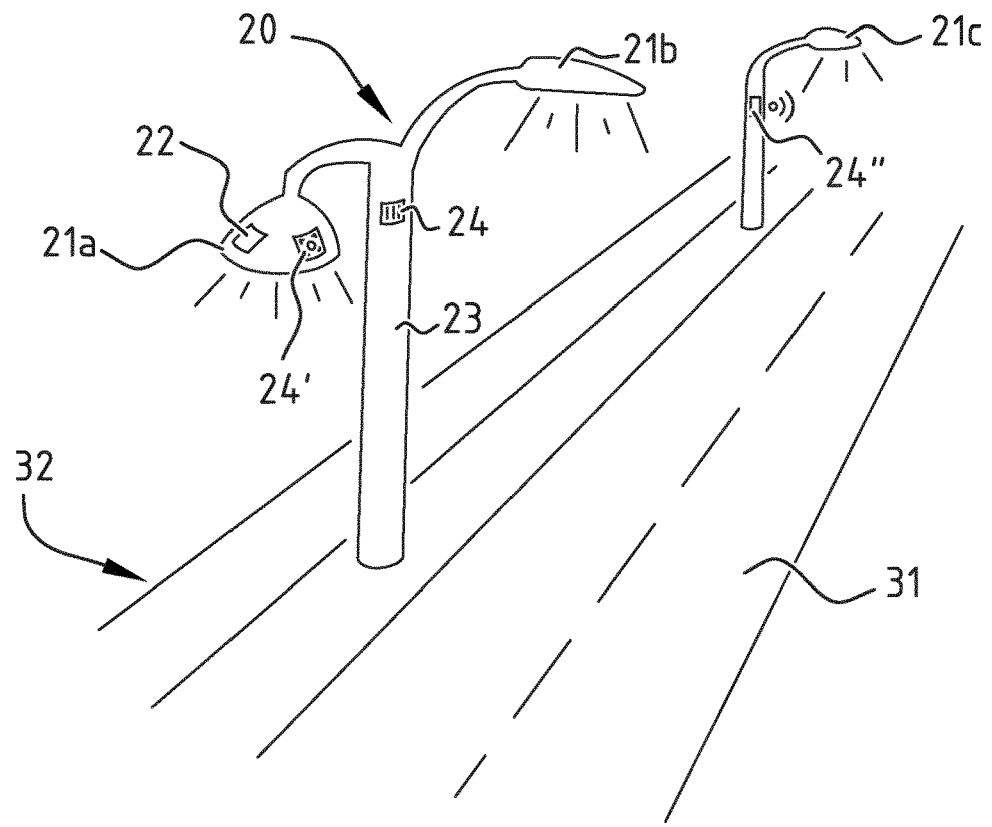
FIG. 4 shows an illustrative view of a system for checking a status of a luminaire according to the invention.
Figure 4:
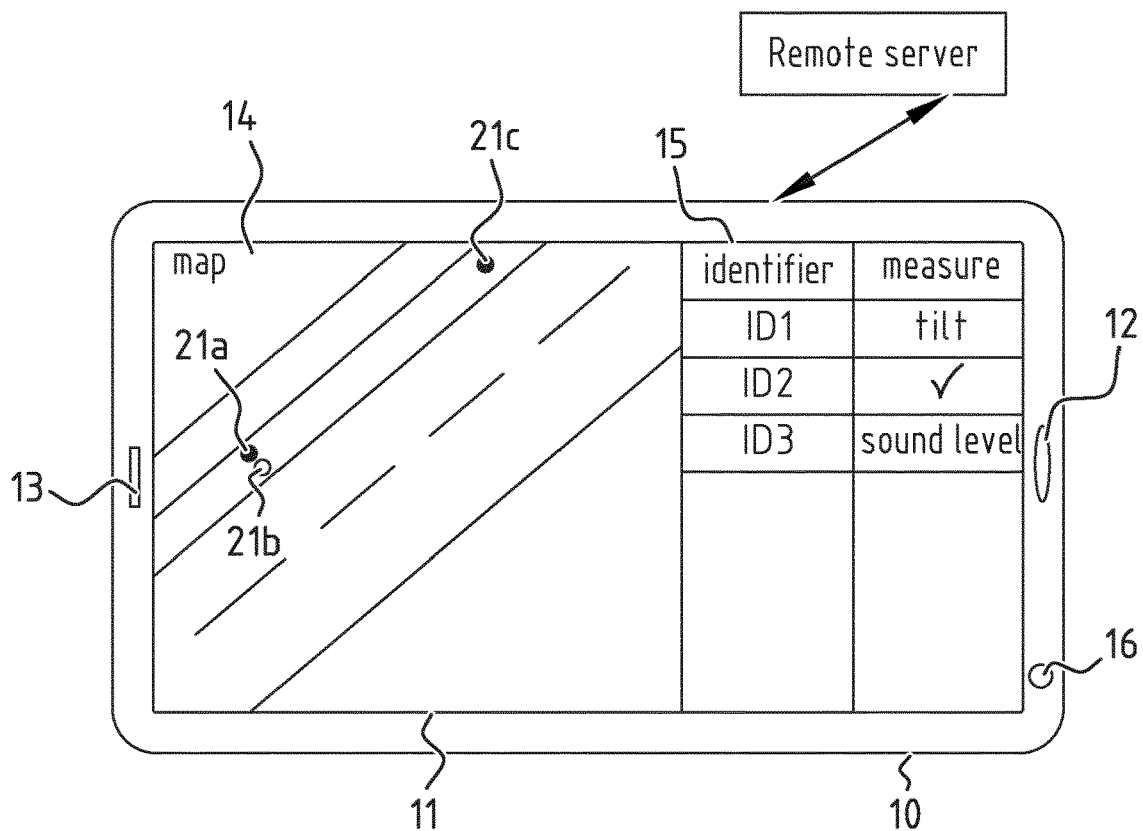

FIG. 4 shows an illustrative view of a system for checking a status of a luminaire according to the present invention. The system includes a mobile terminal 10 and a luminaire 20. The system is for checking a status of the luminaire using the mobile terminal 10 in a vicinity of the luminaire 20. The mobile terminal 10 may be used by a field operator performing installation or maintenance of the luminaire 20.

The mobile terminal 10 comprises: a sensing means, a memory (not shown), a communication means (not shown), and a controlling means (not shown). The sensing means may be at least one of: an accelerometer, an image capturing means, a light sensing means, a sound capturing means, a geo-localization means, a temperature sensing means, an antenna a motion sensor, a pollution sensor, a visibility sensor, a radar sensor. The sensing means of FIG. 4 comprises at least a sound capturing means 13, an image capturing means 16, and an accelerometer (not shown). The controlling means is configured for controlling the steps of the method as described in FIGS. 1-3. The mobile terminal 10 may be, e.g. a laptop, a smartphone, a tablet, wearable device, or a dedicated mobile terminal.

The luminaire 20 may comprise one or more luminaire head 21a, 21b, 21c, said one or more luminaire head 21a, 21b, 21c being affixed to a support 23. The support 23 may be a pole, a wall, or an external surface of a tunnel. The one or more luminaire head 21a, 21b, 21c may comprise a main lighting unit. Optionally the luminaire 20 may further comprise a functional module as detailed in FIG. 1.

The luminaire 20 may be an outdoor luminaire By outdoor luminaire, it is meant luminaires which are installed on roads, tunnels, industrial plants, stadiums, airports, harbors, rail stations, campuses, parks, cycle paths, pedestrian paths, or in pedestrian zones for example, and which can be used notably for the lighting of an outdoor area, such as roads and residential areas in the public domain, private parking areas and access roads to private building infrastructures, etc. In the embodiment of FIG. 4, there is a plurality of luminaires 20 positioned between a road 31 and a cycle path 32. The luminaire 20 in the foreground of FIG. 4 comprises a first luminaire head 21a configured for illuminating the cycle path 32, and a second luminaire head 21b configured for illuminating the road 31, said first and second luminaire heads 21a, 21b being mounted on a first pole 23. The luminaire 20 in the background of FIG. 4 comprises a single third luminaire head 21c configured for illuminating the road 31, said single third luminaire head 21c being mounted on a second pole 23.

The first pole 23 of the foreground luminaire 20 of FIG. 4 may be provided with a first identifier 24 of the luminaire, said first identifier 24 uniquely identifying the foreground luminaire 20. In the context of the present invention, luminaire identifiers 24, 24', 24" may be considered as a unique attribute of the luminaire. The identifiers 24, 24', 24" may be of different kinds and represented in a physical form, e.g. serial number, barcode, symbol, or obtainable electronically, e.g. RFID tag, geo-localization position.

The first identifier 24 of FIG. 4 is a barcode arranged on an external surface of the first pole 23. In another embodiment, the first identifier 24 may be arranged on an internal surface of the first pole 23 accessible by a service door or may be located on a surface of a cabinet in proximity of the foreground luminaire 20. In yet another embodiment, a luminaire head of the luminaire is provided to a support other than a pole and the identifier of the luminaire is located in proximity of the luminaire head.

The first luminaire head 21a of the foreground luminaire 20 may be provided with a second identifier 24'. The second identifier 24' may be a QR code arranged on an external surface of the first luminaire head 21a. The second identifier 24' may be an identifier uniquely identifying the first luminaire head 21a. Additionally or alternatively, the second identifier 24' may be arranged on an internal surface of the first luminaire head 21a.

The second pole 23 of the background luminaire 20 of FIG. 4 may be provided with a third identifier 24". The third identifier 24" may be a RFID tag readable by a reading means (not shown) of the mobile terminal 10.

The mobile terminal 10 may comprise an output means. The output means may be at least one of: a display, a speaker, a vibration unit, and/or a light source. The output means of FIG. 4 comprises at least a display 11 and a speaker 12. The mobile terminal 10 may further comprise an input means. The input means may be at least one of: a touch-enabled input panel, a touchscreen, a keyboard, a switch or button, and image capturing means, and/or a sound capturing means. The input means of FIG. 4 comprises at least a touchscreen 11 also acting as the display 11 and a sound capturing means 13 also acting as the sound capturing means 13 of the sensing means.

The controlling means of the mobile terminal 10 may be configured for controlling the output means such that controlling the steps of the method according to any of the embodiments of FIGS. 1-3 may be at least partially assisted by information outputted by the output means. In an embodiment, the outputted information may be information correlated to a required correction to the luminaire status, and the field operator may proceed with the correction assisted by information outputted by the output means.

In another embodiment, the mobile terminal 10 comprises the display 11 and the controlling means may be configured for controlling the display 11 to display information about the controlling performed by the controlling means. The information displayed by the display 11 may be, e.g. one or more guideline to assist the field operator in conducting the steps of the method using the mobile terminal 10, informing the field operator about the progress of the checking of the luminaire status, an input demand from the mobile terminal 10 to be inputted by the field operator via the input means of the mobile terminal 10. For example, the outputted information may be an image-based or a written assistance on the display 11 of the mobile terminal showing to the field operator how to manipulate the mobile terminal 10 during the implementation of the method. Depending on embodiments, the outputted information may be a video assistance on the display 11 of the mobile terminal showing to the field operator how to handle the luminaire and/or one or more components of the luminaire. The assistance provided on the display 11 may be replaced or complemented by a vocal assistance provided through the speaker 12 of the mobile terminal. The skilled person will understand that assistance may be provided through numerous ways to the field operator depending on the output means available.

In the embodiment of FIG. 4, the controlling means is configured to display a geographical map 14 on the display 11 indicating the luminaire 20 for which checking of the luminaire status is required, prior to performing the step of obtaining the identifier 24, 24', 24". The indication of the luminaire 20 for which checking of the luminaire status is required may be at the luminaire level or at a sub-level corresponding to a subpart of the luminaire 20, at the luminaire head-level in FIG. 4. The indication may take the form of a dark spot on the geographical map 14 when checking is required, and a clear spot when it is not. The skilled person will understand that the present invention is not restricted to this specific type of indication.

In the embodiment of FIG. 4, the controlling means is configured to display an overview 15 on the display 11 of the measure of the luminaire status to be acquired and the associated identifier 24, 24', 24" of the luminaire, prior to performing the step of obtaining the identifier 24, 24', 24".

The identifiers 24, 24', 24" may correspond to identifications ID2, ID1, and ID3, respectively, on the overview 15 displayed on the display 11 of the mobile terminal. The overview 15 may, in correspondence with the identifications ID1, ID2, and ID3, indicates which measures are required to be acquired. For example, the measure of at least one tilt angle may be required for the second luminaire head 21b associated to the identifier 24' and corresponding to identification ID1. Optionally, the geographical map 14 may also indicate an optimized path between the luminaires 20 needing attention based on multiple factors, such as the distance from one luminaire to another one, the time of the day, the type and/or number of measures to be acquired, the road traffic, etc.

The acquiring of the at least one tilt angle may be executed by first providing the mobile terminal 10 to a predetermined surface 22 of the second luminaire head 21b, a predetermined external surface 22 in the embodiment of FIG. 4. In another embodiment, the mobile terminal 10 may be mounted to a clamping device. The clamping device may be configured for being provided to the luminaire head 21b such as to fix the mobile terminal 10 with respect to the luminaire head 21b at a desired angular positioning. In still another embodiment, the mobile terminal 10 may be mounted to a suction device, said suction device being configured for being attached to a surface of the luminaire using suction. In yet another embodiment, the luminaire head may comprise a socket, e.g. a twist-lock socket and the mobile terminal may be mounted to a support having a corresponding interface, e.g. a twist-lock interface configured for being provided to the socket. Optionally, the mobile terminal 10 may be linked to the field operator via a lifeline configured for preventing the mobile terminal 10 to fall to the ground in case of a fall of the mobile terminal 10.

Additionally, in the embodiment of FIG. 4, the overview 15 may indicate that the measure of an environmental condition of the luminaire 20, a sound level, may be required for the third luminaire head 21c associated to the identifier 24" and corresponding to identification ID3. The measure of the sound level may be used, for example, to correlate with a sound level captured by a sound capturing sensor of the background luminaire 20 and thereafter determining a status of the sound capturing sensor part of the background luminaire 20, i.e. working or out of order.

The controlling means of the mobile terminal 10 may be configured for controlling the input means such that controlling the steps of the method according to any of the embodiments of FIGS. 1-3 may be at least partially assisted by command inputted via the input means. In an embodiment, the mobile terminal 10 may comprise the speaker 13 and a command may be vocally inputted via the speaker to assist one of the steps of the method. In another embodiment, the mobile terminal 10 may comprise the speaker 12 and the sound-capturing means 13 allowing for an at least partially speech controlled implementation of the method including both vocal commands and vocal assistance. In yet another embodiment, the field operator may complete any of the steps of the method by a manual entry of information on the mobile terminal 10 via the touchscreen 11 of the mobile terminal. The skilled person will understand that commands may be provided through numerous ways by the field operator depending on the input means available.

The mobile terminal 10 of FIG. 4 may be communicating, via the communication means of the mobile terminal 10, with a remote terminal. Communication with the remote terminal may be established wirelessly or in a wired manner Data may be sent via a wireless network operating over short-range or long-range communication, e.g. Bluetooth, Wi-Fi, Zigbee, LORA (IoT), IR, cellular, or via a wired network, e.g. Ethernet, DALI, DMX, RS485, USB. The memory of the mobile terminal 10 may be a temporary memory, e.g. a buffer memory, or a long-term memory, e.g. a hard disk memory. Use of the memory of the mobile terminal 10 and the communication with the remote terminal may be similar to the description of embodiments of the method with respect to any one of FIGS. 1-3.

It is to be noted that exemplary embodiments of the method described with respect to FIGS. 1-4 may be implemented during installation of a luminaire or maintenance of the luminaire by the field operator. Additionally, when installing the luminaire, or when practicing maintenance of the luminaire requiring some installation steps of the luminaire, the identifier of the luminaire may be linked to one or more images taken during manufacturing of the luminaire Installation instructions may be obtained by the mobile terminal based on the one or more images taken during manufacturing of the luminaire and associated to the obtained identifier.

Alternatively, the acquisition of the measure of the luminaire status may help in determining a cause of failure of the luminaire, and, based on the one or more images taken during manufacturing of the luminaire associated to the identifier, a replacement kit to solve the failure of the luminaire may be prepared. Preparation of this replacement kit is further detailed in relation with FIGS. 5A-8.

FIGS. 5A-5D illustrate the initial steps of a method for preparing a replacement kit for a luminaire, typically a failing luminaire or a luminaire requiring maintenance. The maintenance may involve e.g. an upgrade of the luminaire or may involve a replacement of a component which still functions but might fail in the future. These initial steps comprise the taking one or more images using one or more cameras C during assembly of the luminaire. FIGS. 5A-5D show consecutive assembly steps for assembling a luminaire in a simplified manner, and a skilled person understands that in practice many more steps may be present in the assembly process.

Figure 5A:
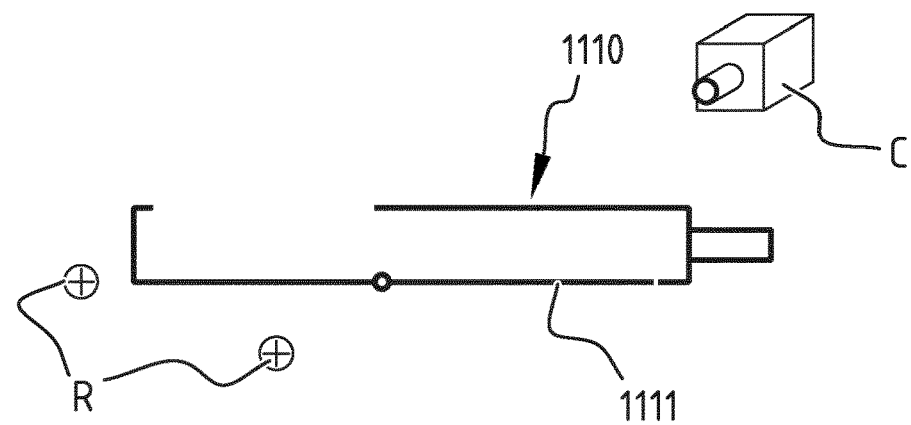
FIGS. 5A, 5B, 5C and 5D schematically illustrate an exemplary embodiment of a set of steps of a method for preparing a replacement kit for a luminaire.

FIG. 5A shows the housing 1110 of a luminaire head before any components are positioned in the housing. One or more first images, e.g. photographic images, may be taken of the housing 1110 in this condition, e.g. an image of the inside and the outside of the luminaire, optionally from different viewing directions. As illustrated one or more visually discernible references R located at a known location, may be arranged in the vicinity of the housing 1110, e.g. on a surface on which the housing is supported. Alternatively or in addition, one or more references may be arranged on the housing 1110 or on any components to be arranged in or on the housing (not shown). The images are taken so as to include the one or more references. Such references R may be used to link the various images to each other and/or to determine dimensions in the images and/or to facilitate the performing of a quality check. For example, the references may be used to check proper positioning of the components when performing quality control. The references R are only shown in FIG. 5A but the skilled person understands that such references may be present in all stages of the assembly process and for example also in the stages shown in FIGS. 5B-5D.

Figure 5B:
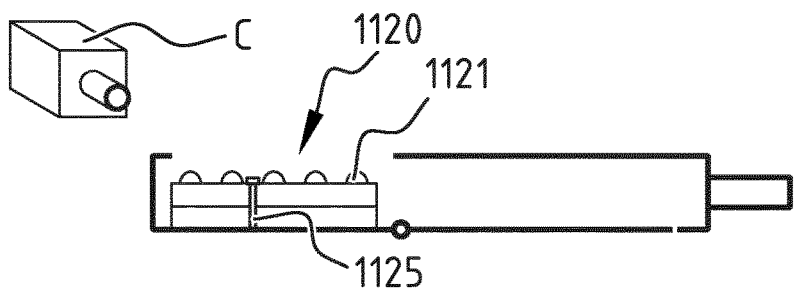

FIG. 5B shows a following step where a light module 1120 with a light source 1121 mounted on a support is included in the housing 1110. The light module 1120 may be fixed to the housing 1110 using fixation means 1125. A further set of images may be taken in this stage of the assembly so that one or more images are obtained showing the light module 1120 in the housing 1110 and further showing the fixation means 1125. Optionally, one or more optical elements (not shown) may be mounted on top of the light module 1120, such as one or more lens elements and/or one or more lens plates. Optionally one or more references may be added to the one or more optical elements and to the light module, e.g. to a PCB of the light module. A further set of images may be taken after the mounting of the one or more optical elements. The references may be used to check proper positioning/alignment of the one or more optical elements with respect to the light module 1120 when performing a quality control.

Figure 5C:
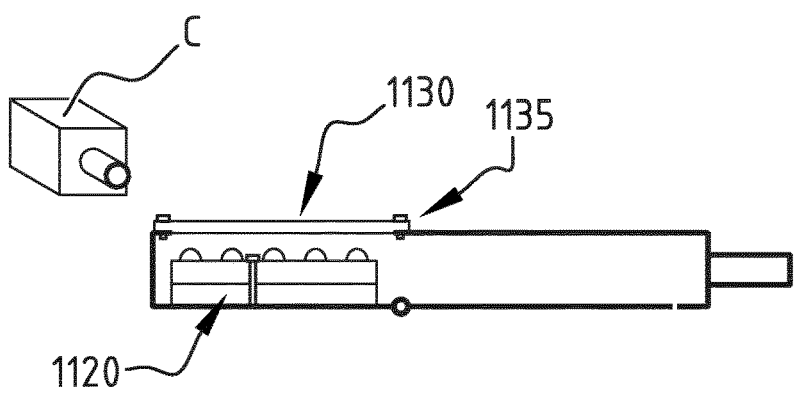

FIG. 5C shows a following step where a transparent or translucent cover 1130 is provided to close an opening in the housing 1110 using fixation means 1135. A further set of images may be taken in this stage of the assembly process so that one or more images are obtained including the mounted cover.

Figure 5D:
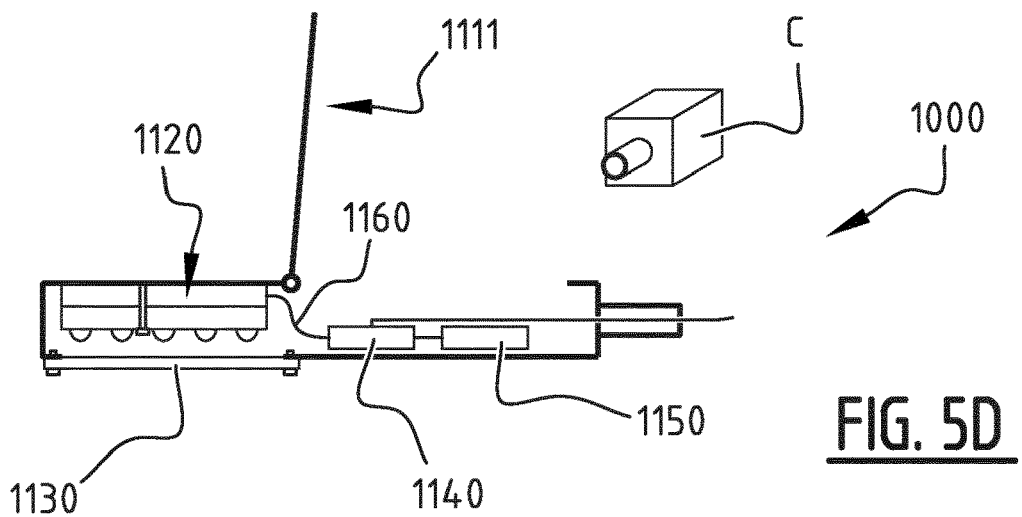

FIG. 5D shows a further step where a door 1111 of the housing 1110 is opened to access a compartment of the housing and where multiple components 1140, 1150 are arranged in the compartment of the housing 1110. Wiring and/or other connection means 1160 are put in place to interconnect the various components 1120, 1140, 1150 arranged in the housing 1110. A further set of images may be taken in this stage of the assembly process so that one or more images are obtained including the various components 1120, 1140, 1150 and the wiring and/or other connection means 1160.

More generally, multiple components which are electrically and/or mechanically connected via one or more electrical and/or mechanical connections may be provided in or on the housing 1110, and the one or more images may comprise one or more images of the one or more electrical and/or mechanical connections, e.g. an interconnection between components or a connection between the housing and a component.

It is noted that the manufacturing may be performed in many different ways and that the steps illustrated are merely an example. In other examples, the light module may be mounted after having arranged other components in the housing. Also, some components may be grouped in a gear unit which is arranged as a whole in the housing. Further, where FIG. 11D illustrates that the housing of the luminaire is turned around for arranging components 1140, 1150, in other embodiments the light module and the components may be arranged without having to turn around the luminaire.

It is further noted that the steps of FIGS. 5A-5D may be repeated for a series of the same type of luminaires. Thus images may be captured for each luminaire that is being manufactured on a certain manufacturing line.

After manufacturing, the luminaire 1000 is installed in the field and may operate autonomously for years without requiring any significant maintenance. Upon failure of the luminaire or when performing maintenance of the luminaire, the availability of the one or more images will allow preparing of a replacement kit for the luminaire using the one or more images and/or a digital dataset based on the one or more images. Indeed, even after many years, the details about the internal structure of the luminaire head can be easily consulted so that a replacement kit can be prepared in a very accurate manner, wherein any required components (including any required connection means) can be easily derived, either directly or indirectly via an intermediate digital dataset, see further, from the one or more images.

Figure 6:
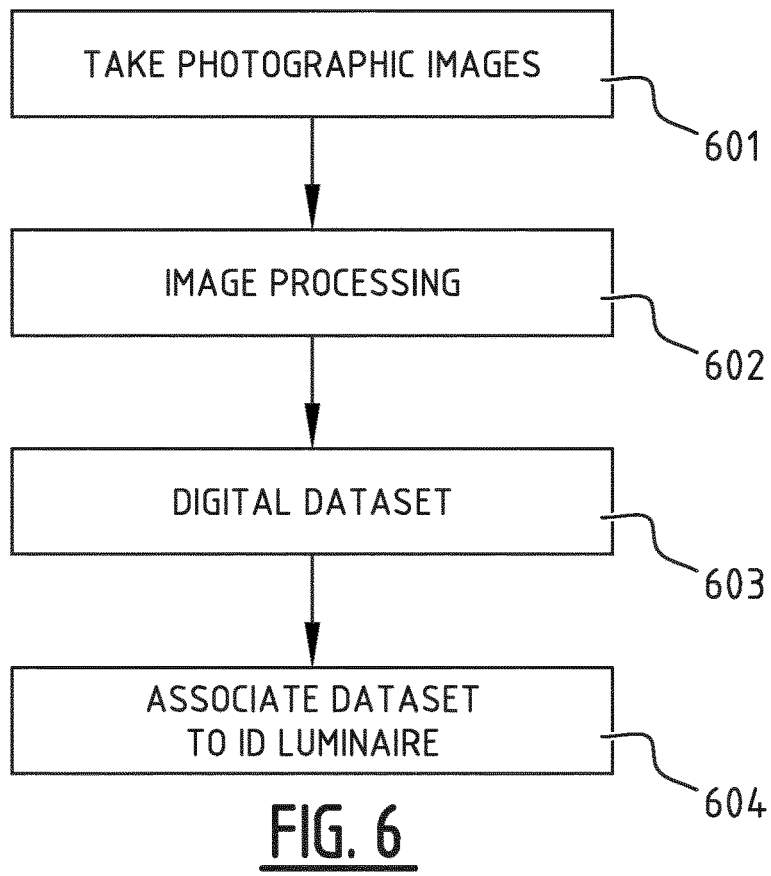
FIG. 6 schematically illustrates an exemplary embodiment of the building of a digital dataset for a luminaire.

FIG. 6 illustrates an exemplary embodiment of the method comprising in a first step 601 the taking of images, for example photographic images, e.g. in the manner described above in connection with FIGS. 5A-5D. In a second step 602, the one or more images are image processed in order to derive data form the images and/or to link the various images to each other. Next in step 603, a digital dataset, e.g. a three-dimensional model of the luminaire is built based on the results of the image processing of the one or more images. For example, the building of a digital dataset may include the building of a three dimensional (3D) model of at least a portion of the luminaire, e.g. of the entire luminaire head 1000 of FIG. 5D. The three-dimensional model may be built in such a manner that it allows inspecting the interior of a luminaire head by navigating in the 3D model. In that manner any components and connections within the housing can be inspected in a convenient manner. It is noted that the building of a digital dataset in step 603 may also take into account other data besides the one or more images, such as technical drawings of the housing 1110 and any components linked to the housing, one or more datasheets of one or more components 1120, 1125, 1130, 1135, 1140, 1150 of the luminaire, a 3D scan of the luminaire, etc. Preferably, such datasheets are included in an automatic manner in the digital dataset. If the digital dataset comprises a 3D-model of the luminaire, then the datasheets may be linked to the components 1120, 1125, 1130, 1135, 1140, 1150 in the 3D-model such that a user can visualize a datasheet e.g. by pointing at or clicking on a component in the 3D-model.

In a further step 604 the obtained digital dataset may be associated with an identification of the assembled luminaire. The method may then further comprise the step of providing the luminaire head 1000, upon installation in situ, with a readable identification means configured to allow an operator to read the identification of the luminaire using a mobile terminal when in the vicinity of the luminaire. Such readable identification means may be a QR code or a bar code or a digital storage device, such as an RFID device, storing a digital identification which can be read in a wireless manner e.g. by NFC. An operator may then read the identification e.g. using a mobile device such as a mobile computer device, and using the read identification, the operator may obtain the associated one or more images or the associated digital dataset. In that manner, an operator can easily obtain many details about the luminaire without having to open the housing of the luminaire. This may allow an operator to see the interior of the luminaire e.g. before installing any components included in the replacement kit.

Additionally, one or more images may be captured after installation. The one or more images may be added to the one or more images or the digital dataset already associated to the readable identification, e.g. by registering the captured one or more images on a remote server.

The identifications of a plurality of luminaires (e.g. a plurality of luminaires of a luminaire network) may be registered on a remote server together with the associated datasets and an operator may have access to the digital dataset of each luminaire of the plurality of luminaires. The operator may have access to the remote server and may be able to consult the digital dataset of a particular luminaire without having to go to the premises of the luminaire, in order to prepare or order a suitable replacement kit. For example, the operator could see on the screen a map with the plurality of luminaires and an indication that one luminaire has failed. Then by clicking on the identified luminaire in the map he could get access to the digital dataset allowing him to order a suitable replacement kit.

Figure 7:
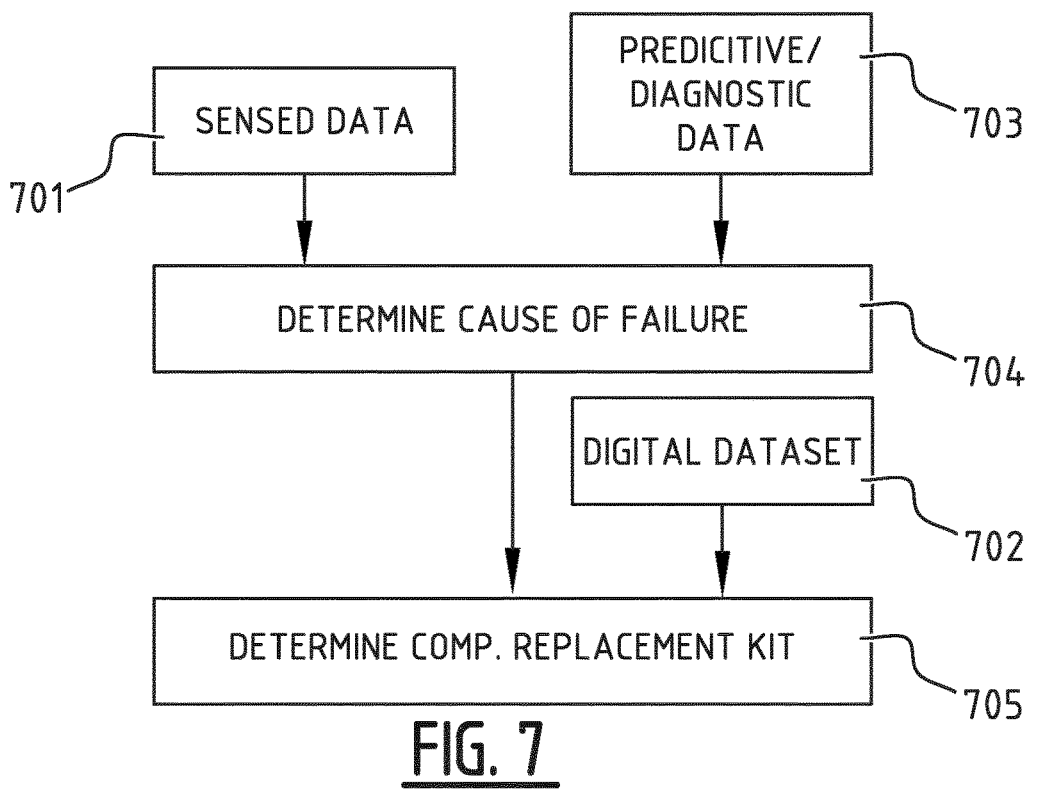
FIG. 7 schematically illustrates an exemplary embodiment of a set of steps of a method for preparing a replacement kit for a luminaire.

FIG. 7 illustrates how the determined digital dataset obtained in step 603 may be used to prepare a replacement kit. In a first step 704 a cause of current or future failure is determined. The determining 704 of the cause may be based e.g. on any one or more of the following: data 701 sensed by the luminaire, predictive or diagnostic data 703 e.g. based on previous failures of similar luminaires. In a next step 705 one or more components associated with the cause of current or future failure are determined using the digital dataset 702. It is noted that the determining of the one or more components associated with the cause of current or future failure using the one or more images, may be done by using directly the one or more images or by using the digital dataset built based on the one or more images. For example, based on data about failures in similar luminaires in the past, a likely cause of failure may be determined for a more recent luminaire, and next, a suitable replacement kit may be determined for the more recent luminaire. Also, based on sensed data, it may be determined that a luminaire needs maintenance, and using the one or more images (either directly or via the built digital dataset), any components or connection means to be included in the replacement kit may be determined.

The sensed data may include any one or more of the following: a sensed energy consumption e.g. of the entire luminaire or of a component of the luminaire, a sensed temperature, a sensed light intensity, a sensed number of power cut-offs, a sensed number of surges, etc. One of the sensed parameters above or a combination thereof may be an indication that one or more components are malfunctioning. For example, if the consumption does not correspond with an expected consumption based on a set dimming profile, it may be determined that the driver and/or the light source does not function correctly. Also, a temperature increase may be an indication that a component is not operating correctly. Further, a high number of power cut-offs or a high number of surges may influence the lifetime of a component, and may be used as an indication of when a component will fail and needs to be replaced.

When looking for a replacement component, if still available the same component may be chosen, or a component with a similar behaviour. The one or more images or the digital dataset will typically allow an operator to find a good alternative solution if the same component is not available taking into account the available space, wiring, fixation, function, etc. Also, the one or more images or the digital dataset will allow to determine if any additional wiring and/or fixation means will be required e.g. in view of the fact that not exactly the same component is used.

Figure 8:
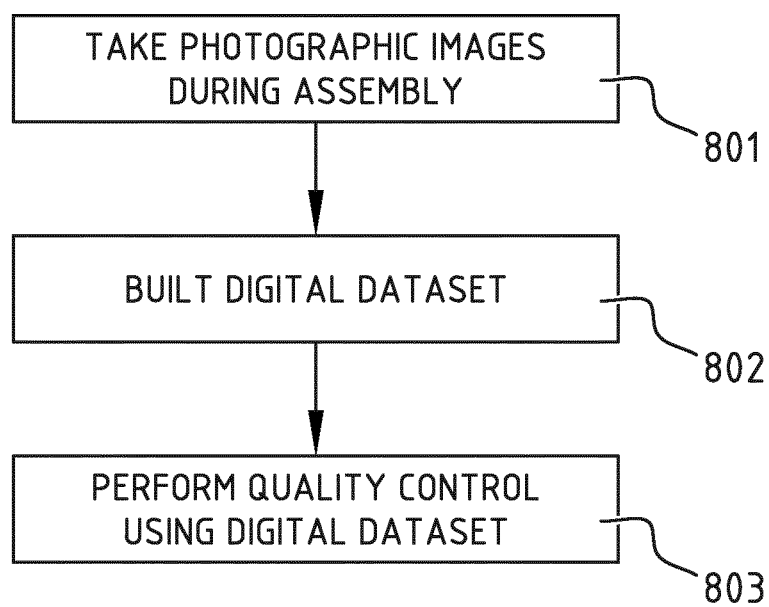
FIG. 8 schematically illustrates an exemplary embodiment of a method for performing quality control of a luminaire.

FIG. 8 illustrates an exemplary embodiment of a method for performing quality control of an assembled luminaire, e.g. a luminaire as shown in FIG. 5D comprising a housing 1110 and a light source 1121 arranged in the housing. In a first step 401, one or more images are taken during assembly of the luminaire, said one or more images comprising at least an image of an interior part of the housing. This step 801 may be performed as explained above in connection with FIGS. 5A-5D. In a second step 802 a digital dataset is built based on the one or more images. This step may be performed as explained above in connection with FIG. 6. In a further step 803 a quality control of the assembled luminaire is performed based on the digital dataset. The performing of quality control can be done for example by an operator checking on a screen or automatically using image processing techniques, without having to physically inspect the luminaire.

The step 803 may comprise checking one or more components and/or connection means in the one or more images using image recognition techniques. For example, wires may be recognised based on specific colours of the wires, and it may be checked whether the wires are present and correctly connected. Also the presence of fixation means such as screws or rivets can be verified.

As explained above, the step of taking one or more images is repeated for a series of luminaires manufactured on the same manufacturing line. The step of performing of a quality control may then comprise comparing the digital datasets of the series of luminaires and detecting deviations between the digital datasets of the series of luminaires and/or using artificial intelligence to analyse the digital datasets of the series of luminaires. For example, if for a series of more than twenty luminaires, a minority thereof has deviating datasets, then it may be decided that only this minority has to be further checked. In another example, at the beginning of the production, the manufactured luminaires may be tested after assembly and the test results may be linked to the associated digital datasets. An artificial intelligence system may learn from the datasets which criteria are useful to check in the datasets to determine if a luminaire fulfils the required standards. Once those criteria have been determined, the testing may be omitted and the system may determine whether a luminaire fulfils the required standards based on the dataset of the luminaire using the determined criteria.

The steps shown in FIGS. 6-8 may be provided or controlled through the use of dedicated hardware as well as hardware capable of executing software. When implemented in a processor, the functionalities may be provided by a single dedicated processor, by a single shared processor, or by a plurality of individual processors, some of which may be shared. The steps may be carried out or controlled through the operation of program logic, through dedicated logic, through the interaction of program control and dedicated logic, or even partially manually, the particular technique being selectable by the implementer as more specifically understood from the context.

Whilst the principles of the invention have been set out above in connection with specific embodiments, it is to be understood that this description is merely made by way of example and not as a limitation of the scope of protection which is determined by the appended claims.

The invention claimed is:

1. A method for checking a status of a luminaire using a mobile terminal in a vicinity of the luminaire, wherein the mobile terminal comprises a sensing means, a memory, and a communication means, the method comprising:
   obtaining, by the mobile terminal, an identifier of the luminaire;
   determining, based on the obtained identifier of the luminaire, a measure of the status of the luminaire to be acquired,
   wherein the determining of the measure of the luminaire status to be acquired comprises: retrieving, from the memory of the mobile terminal, an instruction about the measure of the luminaire status to be acquired based on the obtained identifier of the luminaire;
   acquiring, by the sensing means of the mobile terminal, the measure of the luminaire status; and
   storing, in the memory of the mobile terminal, data about the acquired measure of the luminaire status, said data being associated to the identifier of the luminaire.

2. The method of claim 1, wherein the determining of the measure of the luminaire status to be acquired comprises:
transmitting to a remote terminal by the communication means of the mobile terminal, the obtained identifier of the luminaire; and
receiving from the remote terminal, by the communication means of the mobile terminal, an instruction about the measure of the luminaire status to be acquired based on the obtained identifier of the luminaire.

3. The method of claim 1, wherein the method further comprises:
transmitting, preferably to a remote terminal, by the communication means of the mobile terminal, the data about the acquired measure of the luminaire status associated to the identifier of the luminaire.

4. The method of claim 1, wherein the method further comprises:
determining, based on the acquired measure of the luminaire status, the luminaire status.

5. The method of claim 4, wherein the method further comprises:
obtaining information indicating whether the luminaire status is correct based on the determined luminaire status and a reference status, said information optionally comprising a required correction.

6. The method of claim 5, wherein the mobile terminal comprises an output means, and wherein obtaining information indicating whether the luminaire status is correct comprises:
obtaining information comprising the required correction; and
outputting, by the output means of the mobile terminal, an information correlated with the required correction.

7. The method of claim 5, wherein the information further comprises an indication of a replacement kit for a luminaire to be used, typically to be used upon failure of the luminaire or a maintenance requirement of the luminaire, and wherein a method for preparing the replacement kit comprises the steps of:
during manufacturing of a luminaire, taking one or more images, said one or more images comprising at least an image of an interior part of a housing of the luminaire; and
after installation of said luminaire in the field, upon failure of the luminaire or when performing maintenance of the luminaire, preparing a replacement kit for the luminaire using:
the one or more images; or
a digital dataset based on the one or more images.

8. The method of claim 1, wherein the luminaire comprises a luminaire head, wherein the sensing means of the mobile terminal comprises an accelerometer, and wherein the acquiring of the measure of the luminaire status comprises:
providing the mobile terminal to a predetermined surface of the luminaire head; and
acquiring, via the accelerometer of the mobile terminal, a measure for at least one tilt angle representative for an angular positioning of the luminaire head.

9. The method of claim 1, wherein the sensing means of the mobile terminal comprises an image capturing means, and wherein the obtaining of the identifier comprises:
acquiring, via the image capturing means of the mobile terminal, a visual representation, preferably a QR code or a barcode, of the identifier, said visual representation being provided to a surface in proximity to the luminaire; and
obtaining, by the mobile terminal, the identifier of the luminaire based on the acquired visual representation.

10. A system comprising the mobile terminal and the luminaire, said system for checking a status of the luminaire using the mobile terminal in the vicinity of the luminaire, wherein the mobile terminal comprises:
the sensing means;
the memory;
the communication means; and
a controlling means, said controlling means being configured for controlling the steps of the method of claim 1.

11. The system of claim 10, wherein the luminaire comprises a luminaire head with a predetermined surface, wherein the sensing means of the mobile terminal comprises an accelerometer, and wherein the predetermined surface is configured for receiving the mobile terminal when the controlling means performs the steps of the method of claim 8.

12. The system of claim 10, wherein the mobile terminal comprises an output means, and wherein the controlling means is further configured for controlling the output means such that controlling the steps of the method of claim 1 is at least partially assisted by information outputted by the output means.

13. The system of claim 10, wherein the mobile terminal comprises an input means, and wherein the controlling means is further configured for controlling the input means such that controlling the steps of the method of claim 1 is at least partially assisted by command inputted via the input means.

14. The system of claim 10, wherein the mobile terminal further comprises a display, and wherein the controlling means is further configured for controlling the display to display information about the controlling performed by the controlling means.

15. The system of claim 14, wherein the controlling means is configured to display a geographical map indicating the luminaire for which checking of the luminaire status is required, prior to performing the step of obtaining the identifier.

16. The system of claim 14, wherein the controlling means is configured to display an overview of the measure of the luminaire status to be acquired and the associated identifier of the luminaire, prior to performing the step of obtaining the identifier.

17. The system of claim 10, wherein the sensing means of the mobile terminal comprises: an accelerometer, an image capturing means, a light sensing means, a sound capturing means, a geo-localization means, a temperature sensing means, an antenna, a motion sensor, a pollution sensor, a visibility sensor, or a radar sensor.

18. A method for installing the luminaire using the mobile terminal in the vicinity of the luminaire, said method comprising:
mounting a luminaire head of the luminaire;
performing, using the mobile terminal, the steps of the method of claim 1; and
optionally:
obtaining information indicating whether the luminaire status is correct based on the determined luminaire status and a reference status, said information optionally comprising a required correction; and
performing the required correction.

19. A method for checking a status of a luminaire using a mobile terminal in a vicinity of the luminaire, wherein the mobile terminal comprises a sensing means, the method comprising:
- obtaining, by the mobile terminal, an identifier of the luminaire;
- determining, based on the obtained identifier of the luminaire, a measure of the status of the luminaire to be acquired;
- acquiring, by the sensing means of the mobile terminal, the measure of the luminaire status;
- determining, based on the acquired measure of the luminaire status, the luminaire status;
- obtaining information indicating whether the luminaire status is correct based on the determined luminaire status and a reference status, said information optionally comprising a required correction; and
- optionally, determining, based on the obtained information, a cause of current or future failure of the luminaire head.

20. A method for checking a status of a luminaire using a mobile terminal in a vicinity of the luminaire, wherein the mobile terminal comprises a sensing means, a memory, and a communication means, the method comprising:
- obtaining, by the mobile terminal, an identifier of the luminaire;
- determining, based on the obtained identifier of the luminaire, a measure of the status of the luminaire to be acquired;
- acquiring, by the sensing means of the mobile terminal, the measure of the luminaire status; and
- storing, in the memory of the mobile terminal, data about the acquired measure of the luminaire status, said data being associated to the identifier of the luminaire,
- wherein the sensing means of the mobile terminal comprises an image capturing means, and
- wherein the obtaining of the identifier comprises:
  - acquiring, via the image capturing means of the mobile terminal, a visual representation, preferably a QR code or a barcode, of the identifier, said visual representation being provided to a surface in proximity to the luminaire; and
  - obtaining, by the mobile terminal, the identifier of the luminaire based on the acquired visual representation.

* * * * *